United States Patent
Nitta

(10) Patent No.: US 8,760,126 B2
(45) Date of Patent: Jun. 24, 2014

(54) DRIVING DEVICE FOR CAPACITANCE TYPE ACTUATOR AND DRIVING DEVICE FOR INK JET HEAD

(71) Applicant: Toshiba Tec Kabushiki Kaisha, Tokyo (JP)

(72) Inventor: Noboru Nitta, Tagata-gun (JP)

(73) Assignee: Toshiba Tec Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/846,098

(22) Filed: Mar. 18, 2013

(65) Prior Publication Data

US 2013/0241349 A1 Sep. 19, 2013

Related U.S. Application Data

(63) Continuation of application No. 12/497,825, filed on Jul. 6, 2009, now Pat. No. 8,427,115.

(60) Provisional application No. 61/078,935, filed on Jul. 8, 2008.

(51) Int. Cl.
*H02J 7/00* (2006.01)

(52) U.S. Cl.
USPC ........................................... 320/166

(58) Field of Classification Search
USPC .......... 320/134, 136, 163, 166; 310/317, 318; 347/68
See application file for complete search history.

(56) References Cited

U.S. PATENT DOCUMENTS

| | | | |
|---|---|---|---|
| 6,113,209 A | 9/2000 | Nitta et al. | |
| 6,504,701 B1 | 1/2003 | Takamura et al. | |
| 6,841,920 B2 | 1/2005 | Takamura et al. | |
| 7,049,756 B2 | 5/2006 | Aiba et al. | |
| 7,114,798 B2 | 10/2006 | Takahashi | |
| 2004/0169545 A1 | 9/2004 | Aiba et al. | |
| 2004/0218019 A1 | 11/2004 | Takahashi | |
| 2007/0076026 A1 | 4/2007 | Nakayama | |
| 2007/0103001 A1* | 5/2007 | Chiozzi et al. | 307/10.1 |

FOREIGN PATENT DOCUMENTS

| | | |
|---|---|---|
| JP | 52-084902 | 7/1977 |
| JP | 63-091717 | 4/1988 |
| JP | 09-164676 | 6/1997 |
| JP | 09-164677 | 6/1997 |
| JP | 11-234061 | 8/1999 |
| JP | 2003-011361 | 1/2003 |
| JP | 2003285441 | 10/2003 |

(Continued)

OTHER PUBLICATIONS

Japanese Office Action mailed on Jan. 22, 2013 for Japanese Application No. 2009-161045, 18 pages.

(Continued)

*Primary Examiner* — Edward Tso
*Assistant Examiner* — Aaron Piggush
(74) *Attorney, Agent, or Firm* — Amin, Turocy & Watson, LLP

(57) ABSTRACT

An actuator is sequentially charged with output voltage "E/2" of a voltage source and output voltage "E" of a voltage source. After the charging, "Q/2" of electric charge "Q" stored in the actuator is discharged on a path returning to the voltage source. Subsequent to the discharging, the remaining all electric charge "Q/2" stored in the actuator is discharged on a closed circuit.

4 Claims, 31 Drawing Sheets

(56) References Cited

FOREIGN PATENT DOCUMENTS

| | | |
|---|---|---|
| JP | 2004088947 | 3/2004 |
| JP | 2004-142437 | 5/2004 |
| JP | 2005-288830 | 10/2005 |
| JP | 2006-256189 | 9/2006 |
| JP | 2006-256191 | 9/2006 |
| JP | 2006-333534 | 12/2006 |
| JP | 2007098795 | 4/2007 |
| JP | 2008-023813 | 2/2008 |

OTHER PUBLICATIONS

OA dated Aug. 16, 2012 for U.S. Appl. No. 12/497,825, 15 pages.
First Office Action of Reason for Rejection for Japanese Patent Application No. 2009-161045 Dated Oct. 29, 2013, 8 pgs.

* cited by examiner

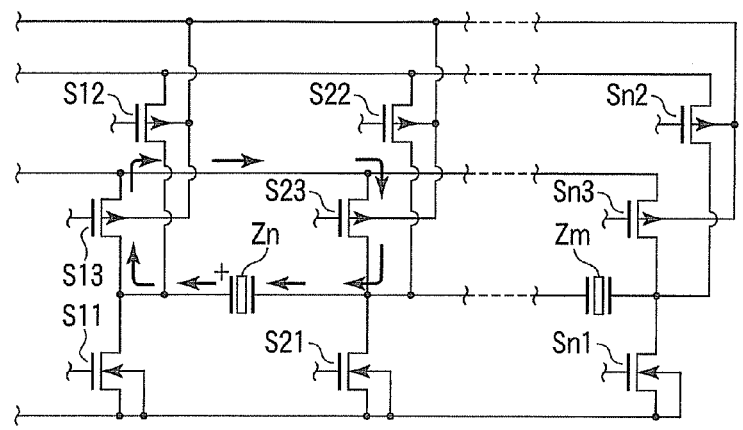
F I G. 17
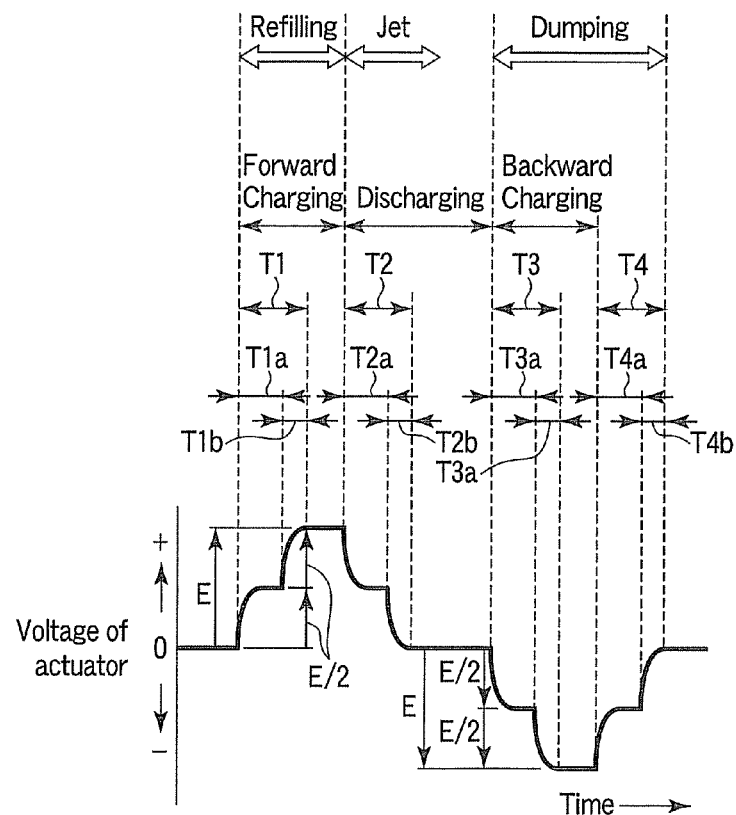
F I G. 18

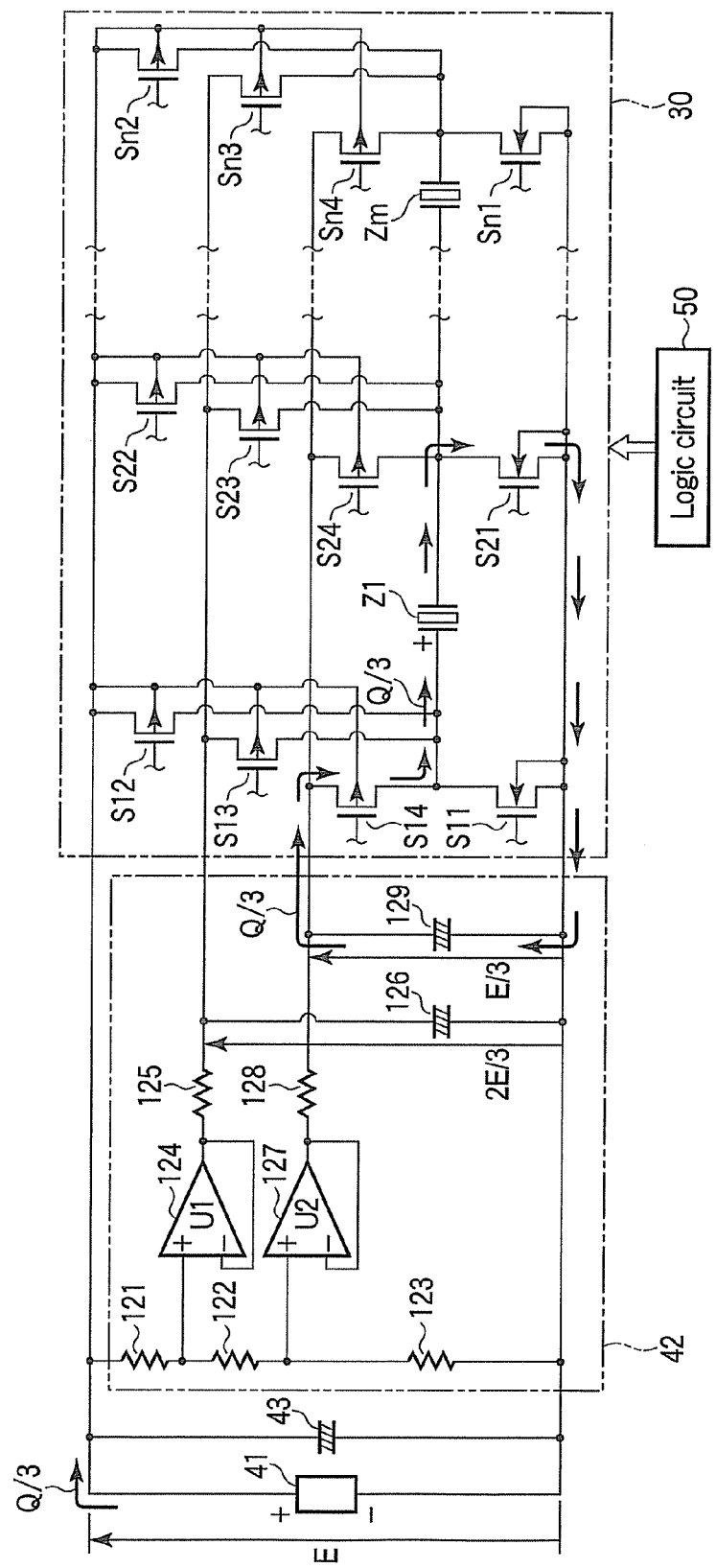
F I G. 19

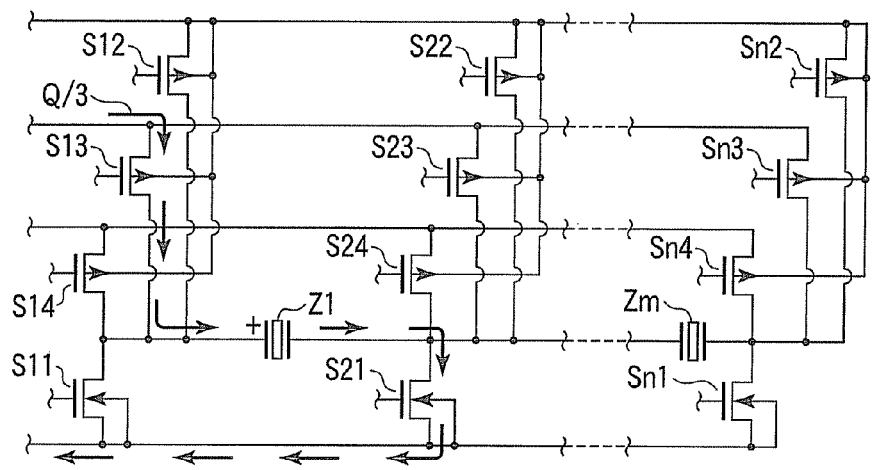
F I G. 20
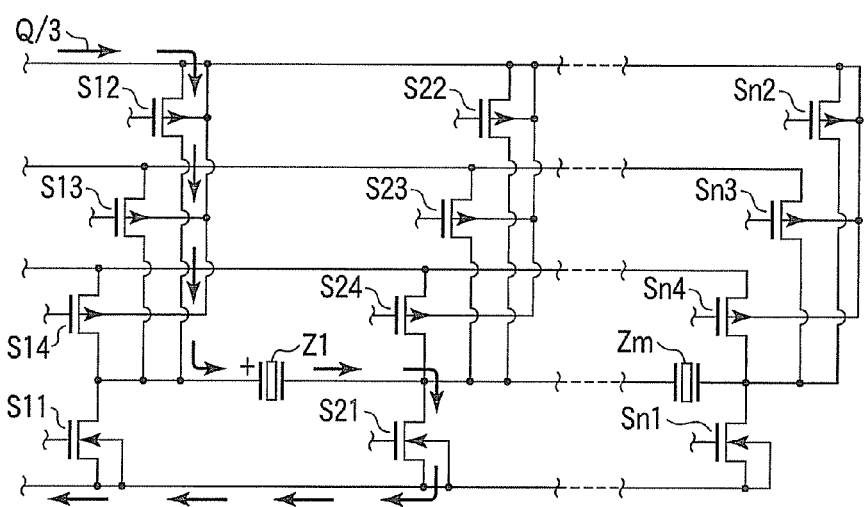
F I G. 21

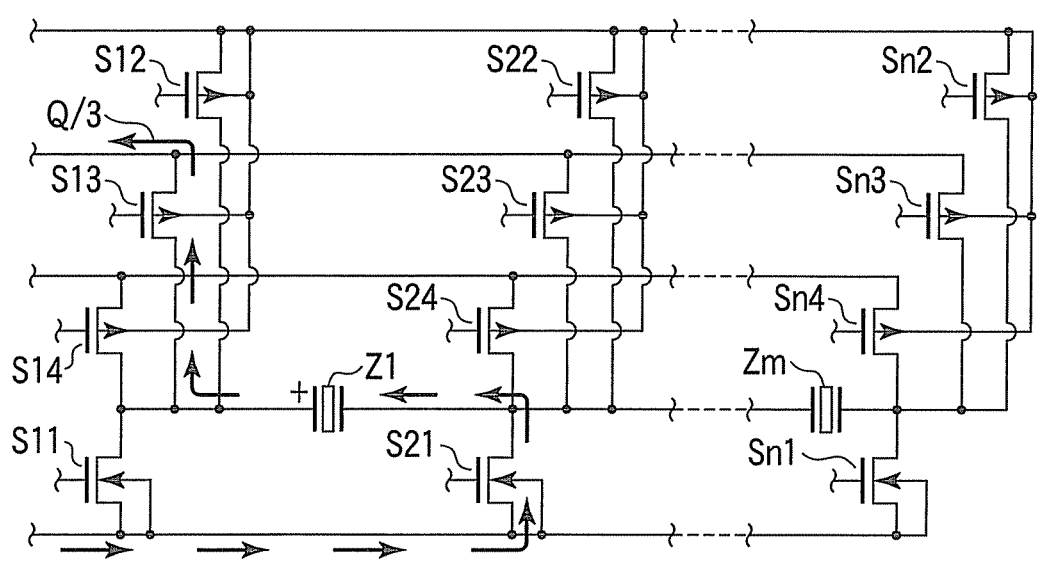
F I G. 22

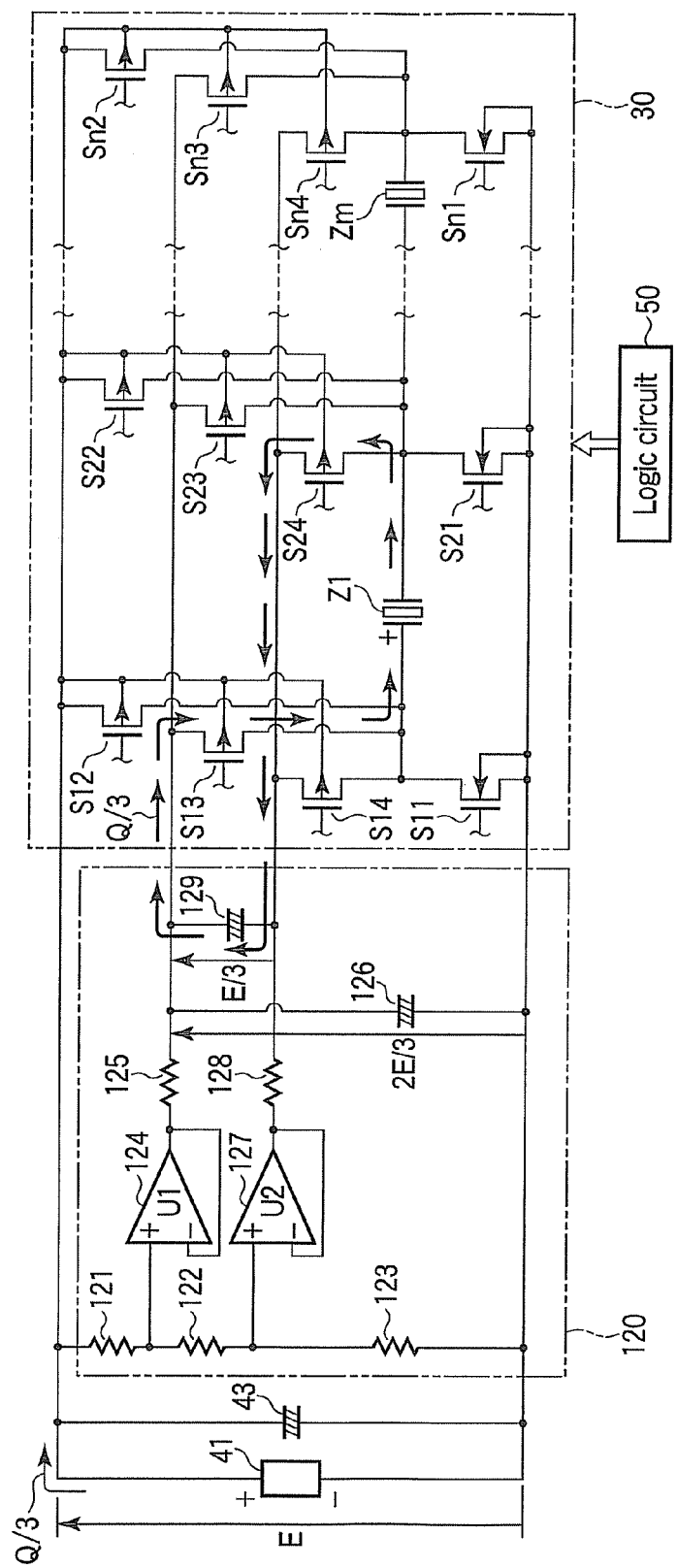
F I G. 25

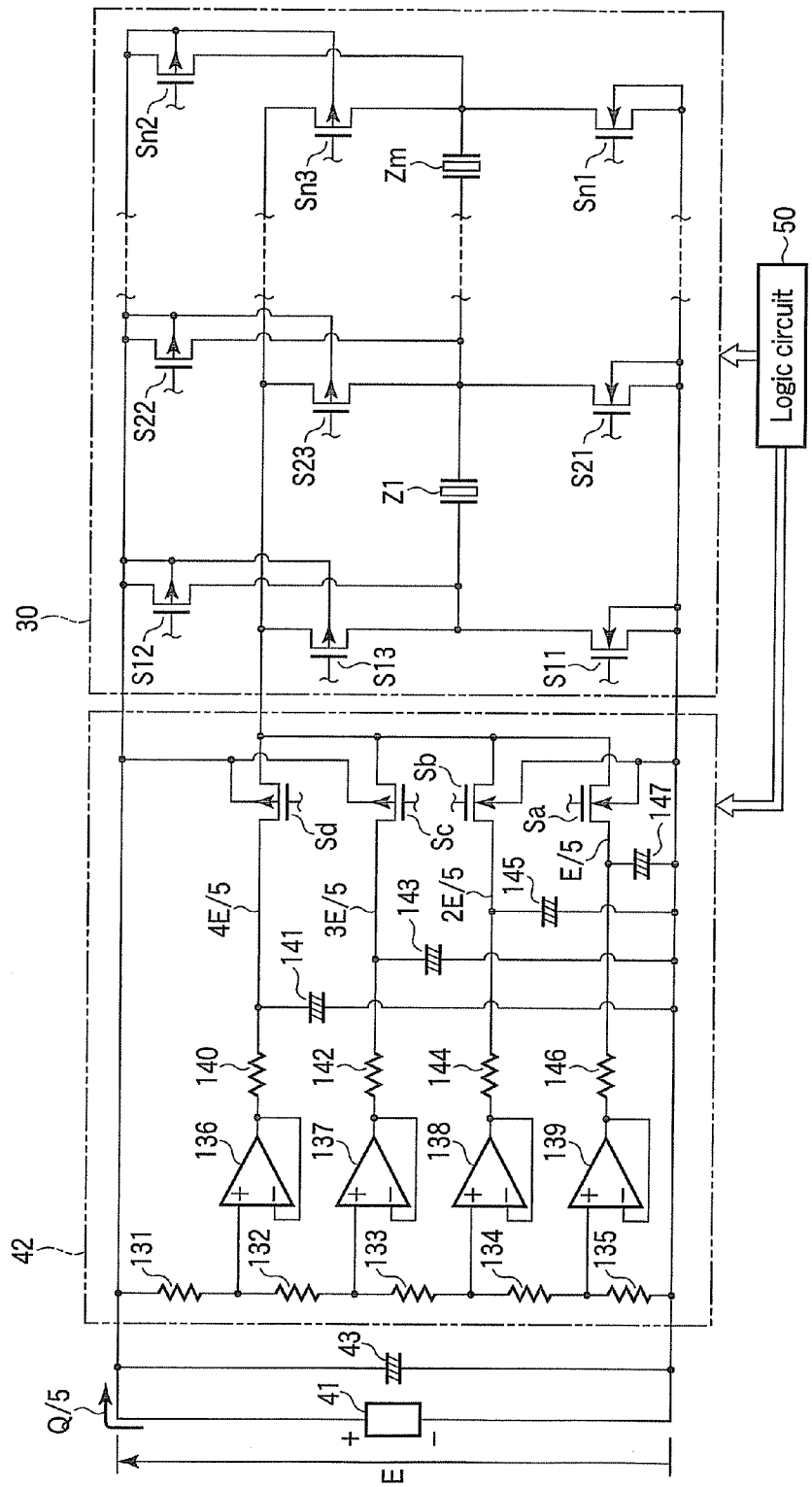
F I G. 27

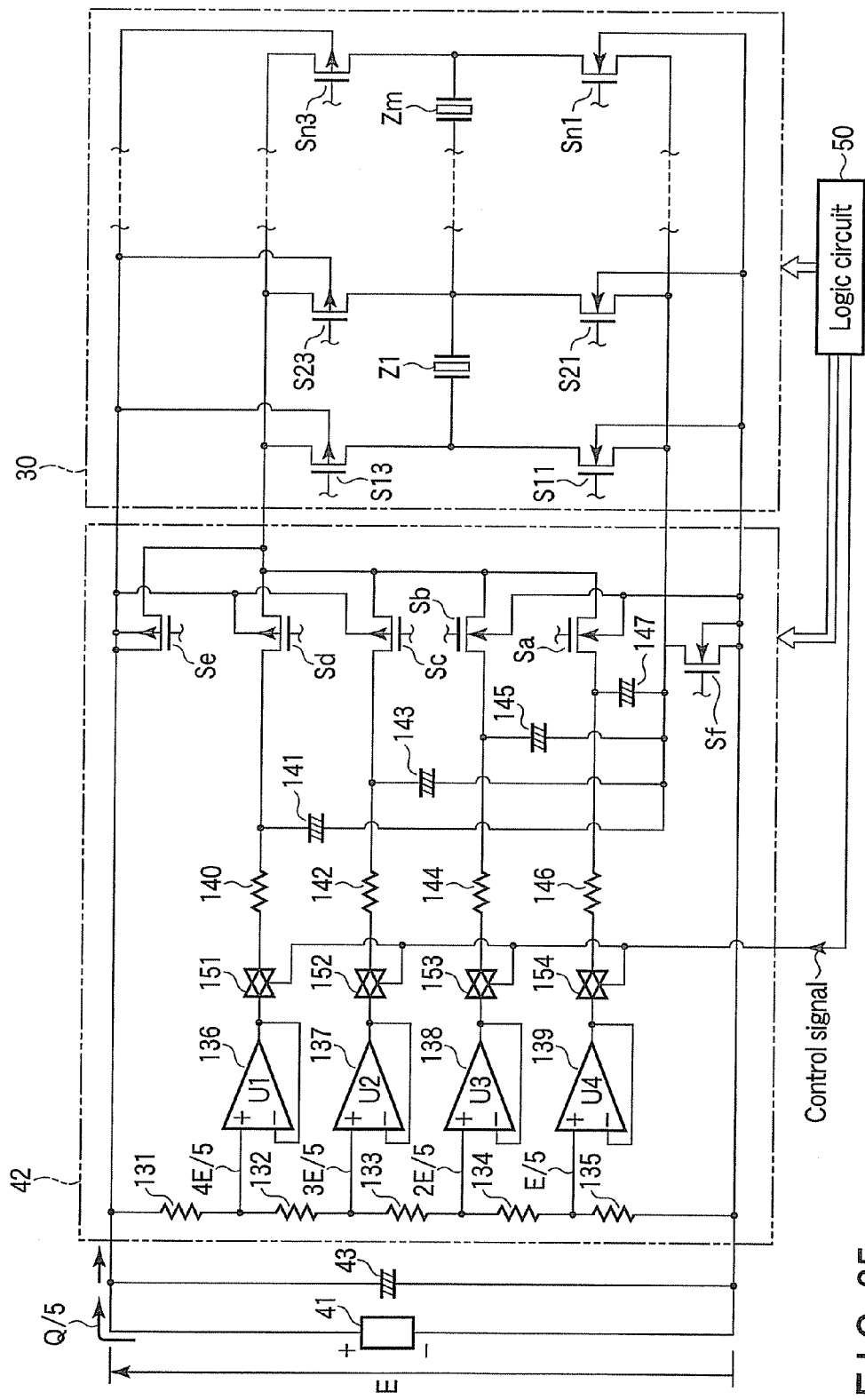
F I G. 35

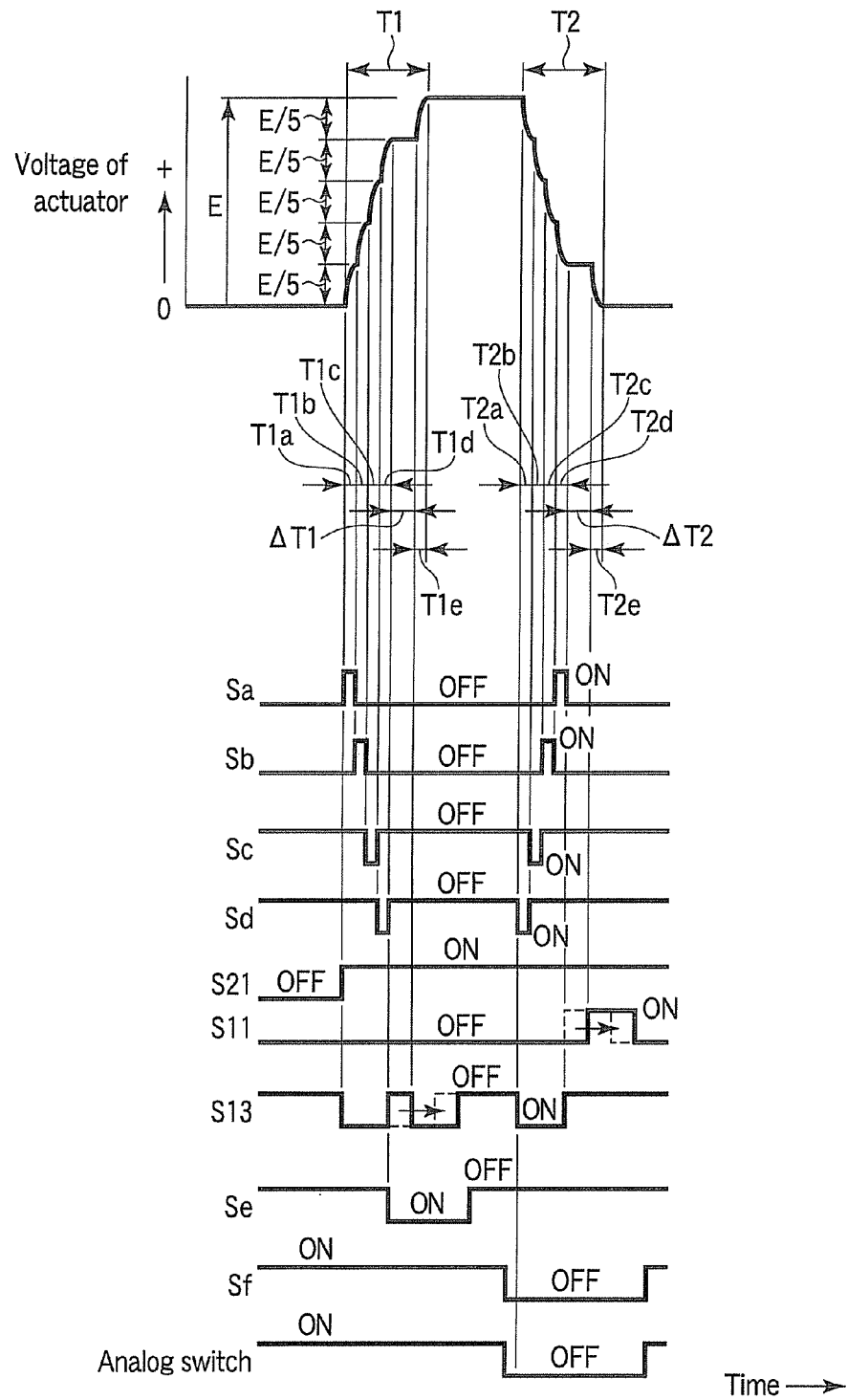
F I G. 37

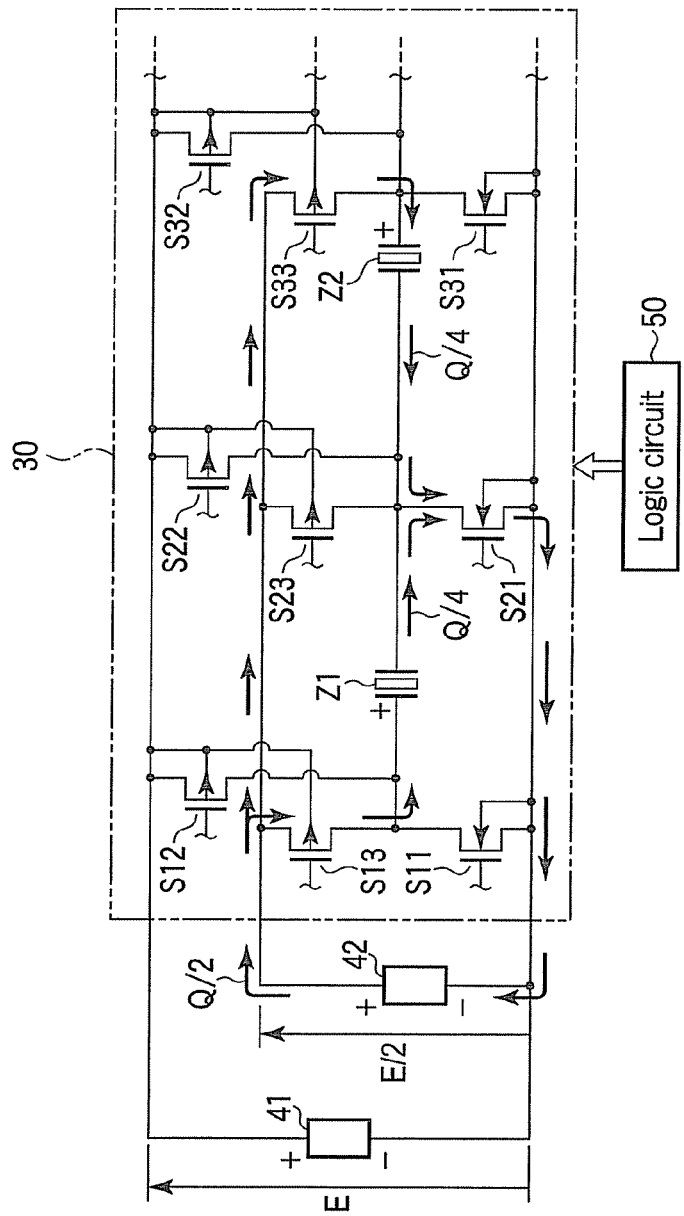
F I G. 38

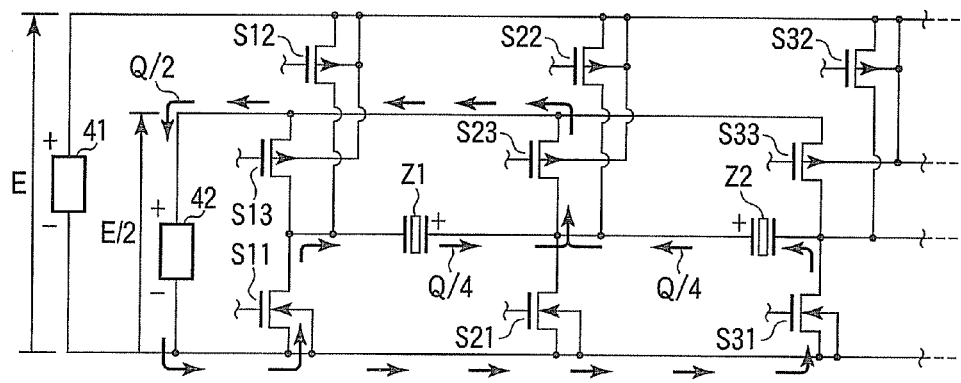
F I G. 44
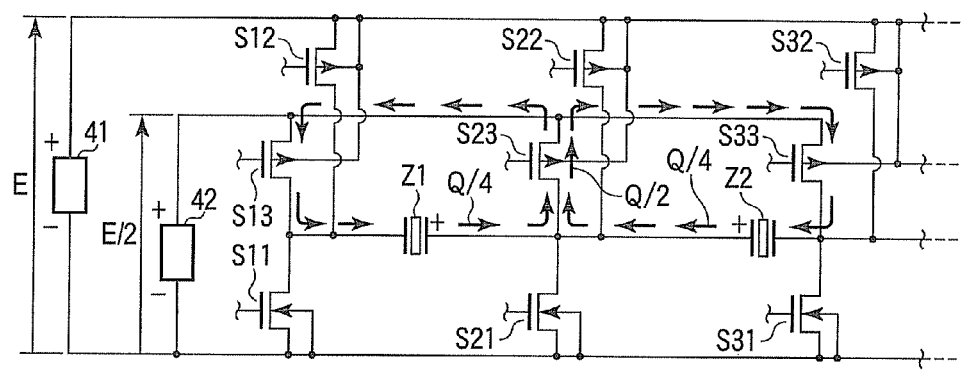
F I G. 45

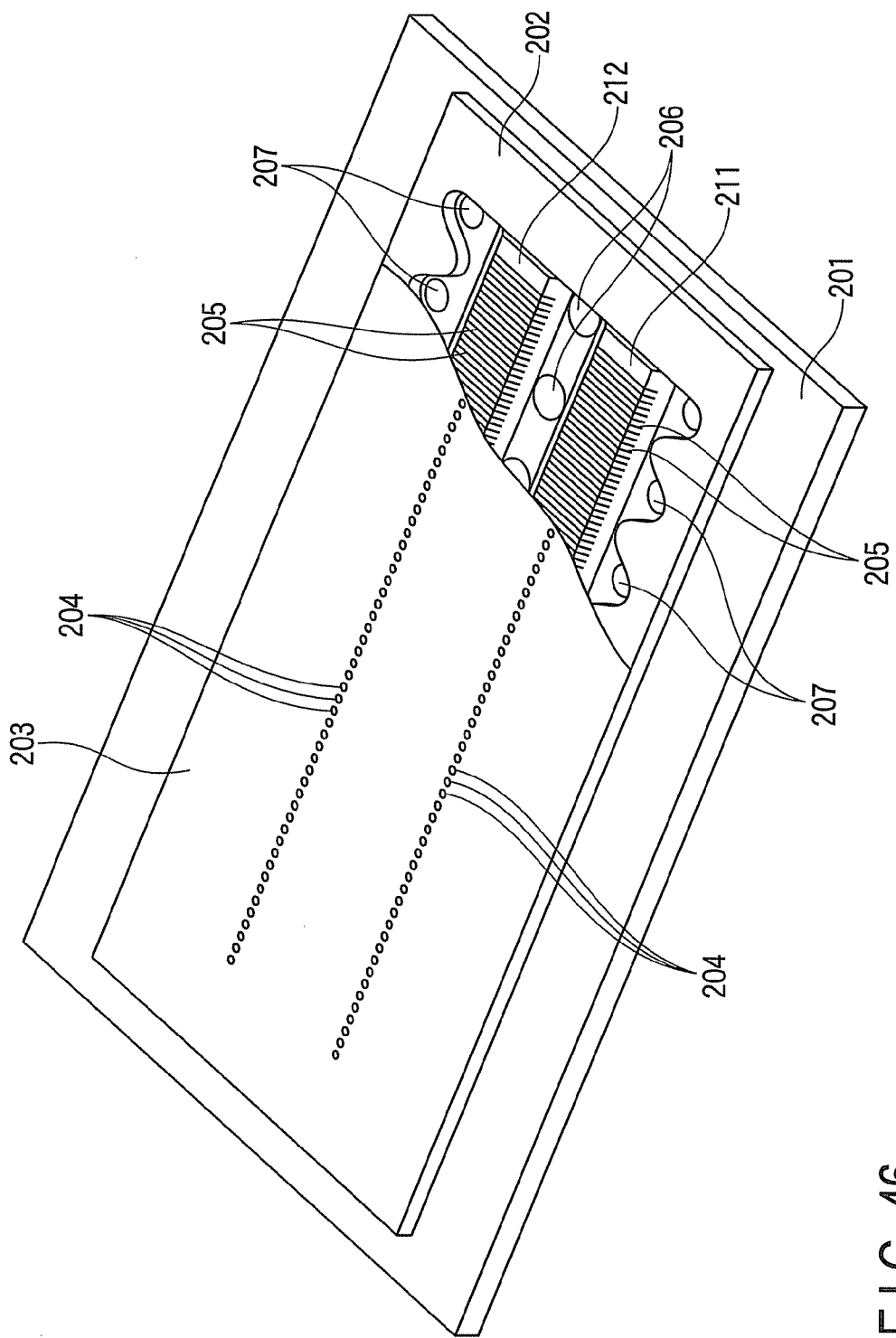
F I G. 46

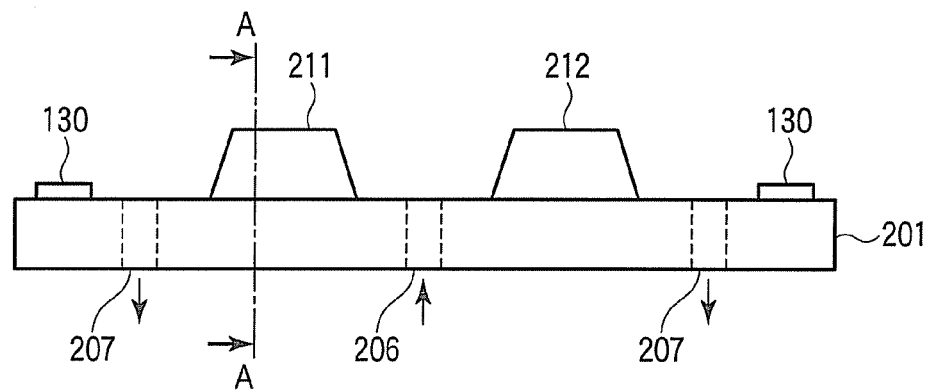
F I G. 47
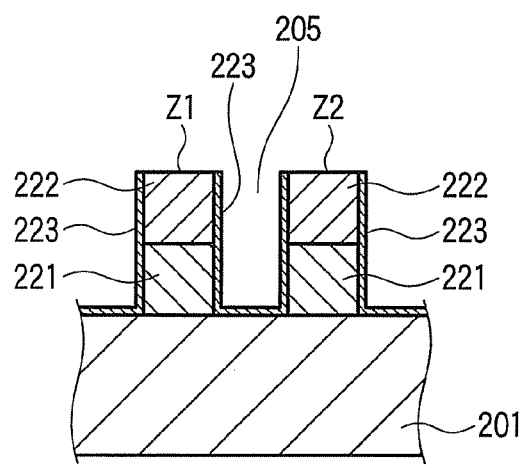
F I G. 48

DRIVING DEVICE FOR CAPACITANCE TYPE ACTUATOR AND DRIVING DEVICE FOR INK JET HEAD

CROSS-REFERENCE TO RELATED APPLICATION

This application is a Continuation of application Ser. No. 12/497,825 filed Jul. 6, 2009, the entire contents of which are incorporated herein by reference.

This application is based upon and claims the benefit of priority from U.S. provisional application 61/078,935, filed Jul. 8, 2008, the entire contents of which are incorporated herein by reference.

TECHNICAL FIELD

The present invention relates to a driving device for a capacitance type actuator and a driving device for an ink jet head.

BACKGROUND

An ink jet head has a large number of piezoelectric elements, which are capacitance type actuators, as actuators for ink jet. A driving device shown in FIG. 1 for driving these actuators is mounted on the ink jet head.

In FIG. 1, a DC power supply P outputs DC voltage "E" of a fixed level. A large number of series circuits such as a series circuit of switch elements S12 and S11, a series circuit of switch elements S22 and S21, and a series circuit of switch elements Sn2 and Sn1 are connected to an output end of the DC power supply P. An actuator Z1 as a piezoelectric element is connected between an interconnection point of the switch elements S12 and S11 and an interconnection point of the switch elements S22 and S21. Actuators Z2 to Zm are respectively connected between the remaining series circuits. The actuators Z1, Z2, ..., and Zm have capacitors C, respectively. The actuators Z1, Z2, ..., and Zm operate according to the sequence of charging and discharging through the switch elements to jet inks.

First, when the switch elements S12 and S21 are turned on, voltage "E" in a forward direction is applied to the actuator Z1 from the DC power supply P and the actuator Z1 is charged. Specifically, as indicated by an arrow, electric charge Q flows out from the DC power supply P and is stored in the actuator Z1 via the switch elements S12 and S21. The electric charge Q is represented as $Q=C \cdot E$.

During this charging, energy extracted from the DC power supply P is "$Q \cdot E$". Energy stored in the actuator Z1 is "$(Q \cdot E)/2$". A difference "$(Q \cdot E)/2$" between the energy "$Q \cdot E$" and the energy "$(Q \cdot E)/2$" is consumed by resistance components on a charging path and changes to heat.

Subsequently, the switch elements S12 and S21 are turned off. Thereafter, when the switch elements S12 and S22 are turned on, the energy "$(Q \cdot E)/2$" stored in the actuator Z1 is discharged on a path passing through the switch elements S12 and S22 from the actuator Z1 as indicated by a broken line arrow. The energy is consumed by resistance components on the discharging path and changes to heat.

A change in the voltage "E" applied to the actuator Z1 is shown in FIG. 2. T1 indicates a charging period by forward energization (application of the voltage "E" in the forward direction). T2 indicates a discharging period of energy stored by the forward energization. T3 indicates a charging period by a backward charging (application of the voltage "E" in the backward direction). T4 indicates a discharging period of energy stored by the backward charging.

In a period of the forward energization including the charging period T1 and following period just before T2, the actuator Z1 is deformed and an ink for jet is refilled in a channel. In the next the discharging period T2, the deformation of actuator Z1 is reset and the ink in the channel is jet. The following period of the charging period T3 in the backward direction and the discharging period T4 are a dumping period for jet.

In the driving device having such a configuration, the energy "$Q \cdot E$" extracted from the DC power supply P during the charging is equivalent to a sum of the energy "$(Q \cdot E)/2$" consumed by the resistance components on the charging path and the energy "$(Q \cdot E)/2$" consumed by the resistance components on the discharging path for each forward and backward charging and discharging.

When the actuator Z1 as the capacitance type actuator is driven, only a very small part of the energy extracted from the DC power supply P is actually used for the operation of the actuator Z1. Most of the energy is consumed by the resistance components on the charging and discharging paths.

The resistance components on the charging and discharging paths are present not only in the actuator Z1 but also on circuits. The resistance components in the actuator Z1 are so-called equivalent series resistance of the actuator Z1. If the equivalent series resistance of the actuator Z1 is smaller, heat generation of the actuator Z1 decreases but heat generation of the circuits increases. Conversely, if the resistance components of the circuits are smaller, heat generation of the circuits decreases but heat generation of the actuator Z1 increases. A total of a heat value of the actuator Z1 and a heat value of the circuits is fixed. Energy consumed by the resistance components on the charging and discharging paths is also fixed.

In general, as means for reducing a heat value of an actuator, there is known a technique for applying voltage of a trapezoidal shape or a triangular shape on the actuator to prevent applied voltage to the actuator from rapidly rising. However, in this case, from the viewpoint of energy consumption, it can be considered that resistance components of a power supply that outputs the voltage of the trapezoidal shape or the triangular shape are large compared with resistance components of the actuator and resistance components of the circuits. In other words, a place where energy is mainly consumed simply shifts from the actuator and the circuits to the power supply. A total heat value and total energy consumption do not change although a heat value of the actuator decreases.

In an ink jet system, it is important to reduce heat generation in the vicinity of sections that jet inks. If the power supply that outputs the voltage of the trapezoidal wave or the triangular wave is adopted and the place of energy consumption shifts from the actuator and the circuits to the power supply, even if the total heat value does not change, this seems to be valuable in terms of temperature management.

However, when the power supply that outputs the voltage of the trapezoidal shape or the triangular shape must be adopted, actually, the power supply is arranged near the actuator and the circuits, then, heat of the power supply is unexpectedly transmitted to an ink jet head. This is because, in general, it is difficult to accurately transmit a high-speed waveform having large power over a long distance. When it is attempted to transmit a high-speed arbitrary waveform without distortion, it is necessary to match impedances of a driving system, a line system, and a reception system. However, when the matching is performed, power is consumed by matching resistance.

As explained above, even from the viewpoint of heat generation near the ink jet head, it is also important to reduce total energy consumption. When the energy consumption is examined, it is important to consider a system including a power supply.

As explained above, when the charging and discharging operation of the actuator Z1 is performed once, the energy extracted from the power supply is "Q·E" and the heat generation of the entire actuator and circuits is also about "Q·E". The energy "Q·E" is useless power that hardly changes to operation energy of the actuator Z1. The energy "Q·E" causes a problem of temperature rise and a problem such as an increase in size of an apparatus shape and an increase in cost involved in an increase in capacity of the power supply.

Energy actually converted into operation energy of the actuator Z1 in the energy supplied from the power supply is energy consumed by only a smaller part of the "resistance components of the actuator Z1". For example, when an ink droplet "6 (pL)" having specific gravity "1" is jet at speed of "10 (m/sec)", energy received by the ink droplet is represented by the following formula:

$$(\tfrac{1}{2}) \cdot 6 \cdot 10^{12} \text{ (kg)} \cdot 10 \text{ (m/sec)}^2 = 0.3 \text{ (nj)}$$

If charging and discharging of voltage 20 (V) is applied to the actuator Z1 having capacitance 500 (pF) once in order to jet the ink droplet, energy consumption is represented by the following formula:

$$500 \cdot 10^{12} \text{ (F)} \cdot 20 \text{ (V)}^2 = 200 \text{ (nj)}$$

Energy efficiency at this point is 0.15%. The remaining 99.85% of energy changes to heat.

The driving device shown in FIG. 1 drives the actuator Z1 with forward charging and backward charging. Specifically, after the actuator Z1 is charged forward performed by turning on the switch elements S12 and S21, when the actuator Z1 is charged by backward energization performed by turning on the switch elements S22 and S11, amplitude corresponding to "2·E", twice as high as the output voltage "E" of the DC power supply P, can be obtained as the amplitude of the actuator Z1. When the actuator Z1 is charged backward performed by turning on the switch elements S22 and S11 first and the actuator Z1 is charged backward performed by turning on the switch elements S12 and S21 next, the amplitude corresponding to "2·E", twice as high as the output voltage "E" of the DC power supply P, can also be obtained.

If there is no discharging period of a closed circuit formed by turning on the switch elements S12 and S22 as indicated by the broken line arrow in FIG. 1, and immediately backward charging at the start point of T2 in FIG. 2 without discharging, power consumption should be "4·Q·E", when is as same as charging with twice voltage.

However, if a discharging path of a closed circuit is formed by turning on the switch elements S12 and S22 as indicated by the broken line arrow in FIG. 1 to discharge the voltage of the actuator Z1 to near zero (V) between charging forward and charging backward, the power consumption can be reduced. It is same if the sequence is opposite as forward charging after backward charging.

It is effective to set a discharging period in this case shorter than a quarter of a period of peculiar oscillation of the ink jet head and long enough for sufficiently reducing voltage across the actuator Z1.

If the discharging period is set between the forward charging and backward charging in this way, the power consumption is halved compared to backward charging without discharging period of charging with twice voltage. While in the former case, the energy lost is $[C \cdot (2 \cdot E)^2]/2 = C \cdot E^2$, but in the later case, the energy lost is $[C \cdot (2 \cdot E)^2]/2 = 2 \cdot C \cdot E^2$.

The effect and the principle are explained in detail in JP-A-2000-185400 (U.S. Pat. No. 6,504,701).

However, an amount of power consumption reduced with this technique is only up to a half of power consumed without discharging period.

In order to further reduce the power consumed with this technique, it is necessary to increase the number of power supplies and perform discharging in plural stages. A technique for increasing the number of power supplies and reducing power consumption is disclosed in JP-A-2005-288830, JP-A-2007-98795, and the like. However, in the technique, although power consumption can be reduced, a driving device is complicated. In particular, a large number of power supplies are necessary.

In JP-A-2008-23813, the inventor of the present invention analyzes the existing power consumption reducing measures and proposes a new power consumption reducing method for reducing power consumption using an inductor. On the other hand, the present invention is devised to obtain effects close to those of JP-A-2008-23813 using an idea different from JP-A-2008-23813 and with a configuration simpler than that disclosed in JP-A-2008-23813.

From a viewpoint different from heat generation and energy consumption, the driving device in the past has problems explained below.

In the discharging indicated by the broken line arrow in FIG. 1, the potential at a drain (which functions as a source during the discharging) of the switch element S12 is higher than the voltage "E" for an instance. The switch element S12 is often placed in an integrated circuit together with other elements. In order to secure reliability of the integrated circuit, the potential at a back gate (not shown) of the switch element S12 has to be set to highest potential in the integrated circuit. Therefore, in the integrated circuit required to have high reliability, usually, it is necessary to prepare another power supply having voltage higher than the voltage "E" and give the voltage of the power supply to the back gate (not shown) of the switch element S12. However, in this case, the number of power supplies increases, power supply voltage of a level higher than operating voltage of the actuator Z1 is necessary, and an integrated circuit having high withstanding voltage that can cope with the power supply voltage is necessary.

In other words, the operating voltage of a drivable actuator has to be set lower than upper limit voltage of an integrated circuit in use by peak voltage at the time of discharging. Because of this limitation, for example, an operating frequency of the actuator Z1 falls or driving force decreases and highly viscous inks cannot be jet.

SUMMARY

It is an object of the present invention to provide a driving device for a capacitance type actuator that can substantially reduce power consumption without requiring a large number of power supplies.

According to an aspect of the present invention, there is provided a driving device for a capacitance type actuator that functions according to a series of charging and discharging sequence, the driving device including:

a driving power supply which outputs charging voltage given to the actuator;

at least one intermediate voltage source which gives intermediate potential at a stage halfway in charging or discharging by the charging and discharging sequence, the intermediate voltage source including a reference voltage source that outputs reference voltage, a voltage follower circuit that buffers output of the reference voltage source, a current limiting unit that limits a current of output of the voltage follower circuit, and a smoothing capacitor that smoothes the output limited by the current limiting unit;

a discharging path for discharging electric charge remaining in the actuator and consuming energy corresponding to the electric charge; and a controller, in charging the actuator, which charge electric charge in the actuator from the intermediate voltage source and thereafter charging electric charge in the actuator from the driving power supply and, in discharging of the actuator, discharging electric charge from the actuator to the intermediate voltage source and thereafter discharging electric charge of the actuator with the discharging path.

DESCRIPTION OF THE DRAWINGS

The accompanying drawings, which are incorporated in and constitute a part of the specification, illustrate embodiments of the invention, and together with the general description given above and the detailed description of the preferred embodiment given below, serve to explain the principles of the disclosure.

FIG. 17 is a circuit diagram showing path in a second stage of discharging according to the sixth embodiment;

FIG. 18 is a diagram of a voltage waveform of actuators according to a seventh embodiment of the present invention;

FIG. 19 is a circuit diagram showing path in a first stage of charging according to a ninth embodiment of the present invention;

FIG. 20 is a circuit diagram showing path in a second stage of charging according to the ninth embodiment;

FIG. 21 is a circuit diagram showing path in a third stage of charging according to the ninth embodiment;

FIG. 22 is a circuit diagram showing path in a first stage of discharging according to the ninth embodiment;

FIG. 25 is a circuit diagram showing path in a first stage of charging according to a tenth embodiment of the present invention;

FIG. 27 is a circuit diagram of a driving device according to an eleventh embodiment of the present invention;

FIG. 35 is a circuit diagram of a driving device according to a thirteenth embodiment of the present invention;

FIG. 37 is a diagram for explaining actions of a modification of the thirteenth embodiment;

FIG. 38 is a circuit diagram showing path in a first stage of charging of a charging path at a first stage of a charging period in a forward direction according to a fourteenth embodiment of the present invention;

FIG. 44 is a circuit diagram showing path in a first stage of discharging of a discharging period following charging in the backward direction according to the fourteenth embodiment;

FIG. 45 is a circuit diagram showing path in a second stage of discharging of the discharging period following the charging in the backward direction according to the fourteenth embodiment;

FIG. 46 is a diagram of an external appearance of an ink jet head according to the fourteenth embodiment;

FIG. 47 is a diagram of the ink jet head shown in FIG. 46 viewed from a side; and FIG. 48 is a diagram of a section of the ink jet head along A-A line shown in FIG. 47 viewed in an arrow direction.

DETAILED DESCRIPTION

A first embodiment of the present invention is explained below with reference to the accompanying drawings.

Figure 3:
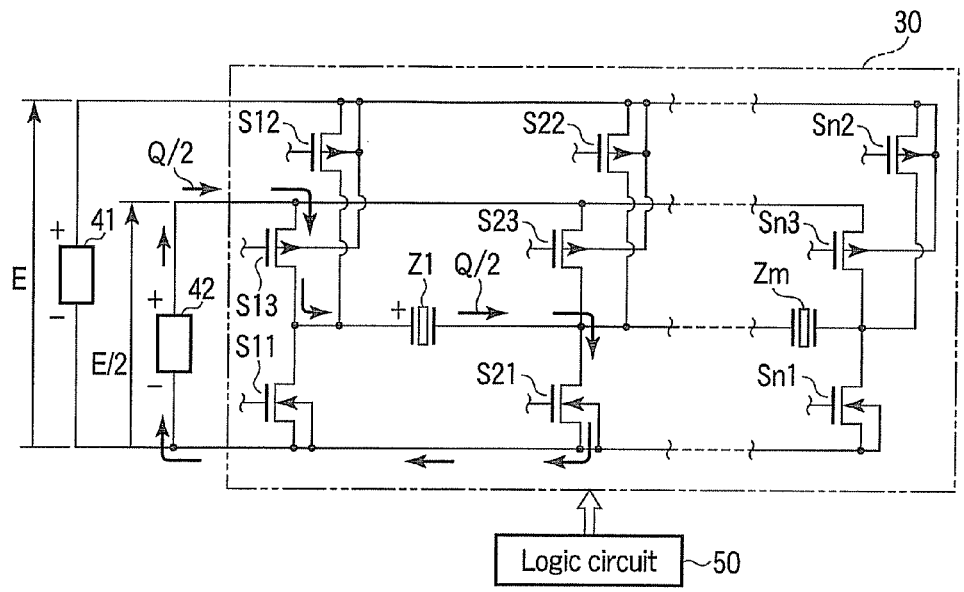
FIG. 3 is a circuit diagram showing path in a first stage of charging according to a first embodiment of the present invention.

As shown in FIG. 3, a first voltage source 41 that outputs DC voltage "E" (V) of a fixed level is prepared. A second voltage source 42 that outputs DC voltage "E/2" (V) of a half level of the DC voltage "E" (V) is also prepared. The voltage source 41 functions as a driving power supply that outputs charging voltage given to a capacitance type actuator. The voltage source 42 functions as an intermediate voltage source that gives intermediate potential at a stage halfway in charging and discharging to the capacitance type actuator. Negative side terminals of the voltage sources 41 and 42 are connected in common. A connection line for the voltage sources 41 and 42 is a zero (V) ground line.

A series circuit of source to drain of a switch element, for example, a P-channel MOS transistor S12 and source to drain of a switch element, for example, an N-channel MOS transistor S11 is connected to both ends of the voltage source 41. A back gate of the MOS transistor S12 is connected to a positive side terminal of the voltage source 41. A back gate of the MOS transistor S11 is connected to the ground line. A series circuit of source to drain of a switch element, for example, a P-channel MOS transistor S22 and source to drain of a switch element, for example, an N-channel MOS transistor S21 is connected to both the ends of the voltage source 41. A back gate of the MOS transistor S22 is connected to the positive side terminal of the voltage source 41. A back gate of the MOS transistor S21 is connected to the ground line.

A series circuit of source to drain of a switch element, for example, a P-channel MOS transistor S13 and the source to drain of the N-channel MOS transistor S11 is connected to both ends of the voltage source 42. A back gate of the MOS transistor S13 is connected to a positive side terminal of the voltage source 41. A series circuit of source to drain of a switch element, for example, a P-channel MOS transistor S23 and the source to drain of the N-channel MOS transistor S21 is connected to both the ends of the voltage source 42. A back gate of the MOS transistor S23 is connected to the positive side terminal of the voltage source 41.

The actuator Z1 is connected between an interconnection point of the MOS transistors S13, S12, and S11 and an interconnection point of the MOS transistors S23, S22, and S21.

MOS transistors S11, S21, . . . , and Sn1, S12, S22, . . . , and Sn2, and S13, S23, . . . , and Sn3 are connected to the voltage sources 41 and 42 and form a charging and discharging circuit 30 that forms an energization path for charging and discharging for actuators Z1, Z2, . . . , and Zm. In the following explanation, attention is paid to the operation of one actuator Z1 and six MOS transistors S13, S12, S11, S23, S22, and S21. However, the operation of the other actuators and charging and discharging circuits corresponding thereto is the same.

Six MOS transistors do not always correspond to one actuator. This means that n is not always equal to 2 m.

For example, in an ink jet head of a shear mode and share wall shown in FIGS. 46, 47, and 48 explained later, two actuators adjacent to each other share an electrode and a driving circuit for the electrode. Therefore, n is equal to m+1. The present invention also includes a driving device that drives such an ink jet head.

Gates of the MOS transistors of the charging and discharging circuit 30 are connected to a logic circuit 50. The logic circuit 50 supplies drive signals to the gates of the MOS transistors and selectively turns on and off the MOS transistors to thereby control charging and discharging of the actuators Z1, Z2, . . . , and Zm.

A charging and discharging unit includes the charging and discharging circuit 30 and the logic circuit 50.

Actions are explained below.

Energy consumption is calculated with attention paid to the movement of electric charge. When charging and discharging of a capacitance type actuator is substantially completed in a short time, this idea is accurate and simple. According to this idea, circuit resistance can be excluded from the calculation.

When the capacitance of the actuator Z1 is represented as C, in order to charge the actuator Z1 to the voltage "E", electric charge "Q=C·E" has to be given to the actuator Z1.

Figure 4:
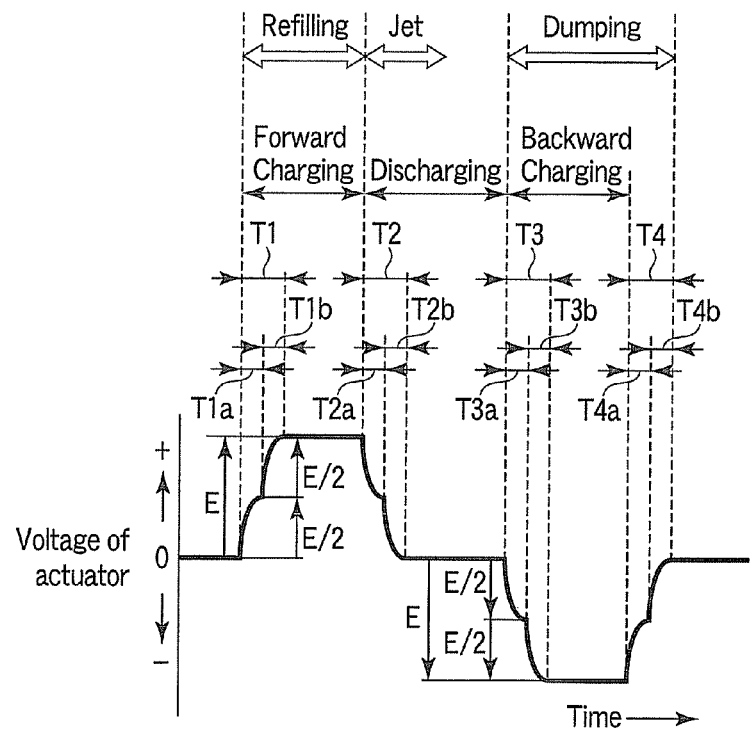
FIG. 4 is a diagram of a voltage waveform of actuators shown in FIG. 3.
Figure 5:
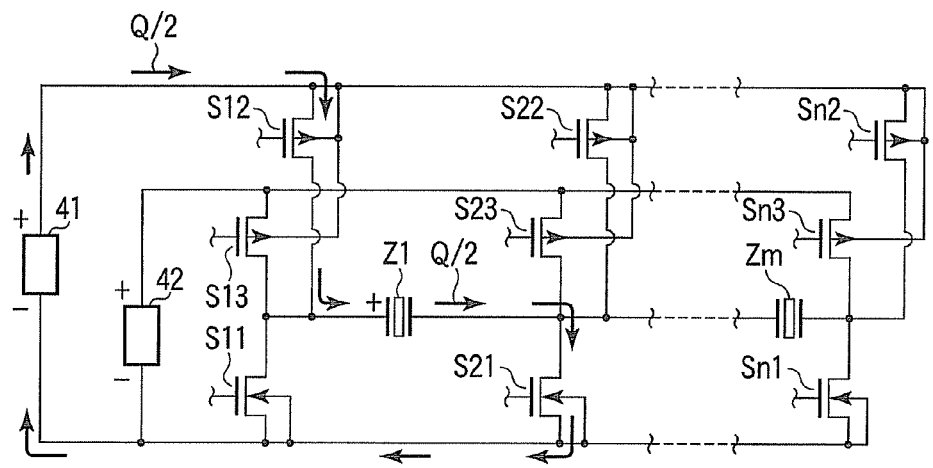
FIG. 5 is a circuit diagram showing path in a second stage of charging according to the first embodiment.

As shown in FIG. 4, the charging period T1 by the forward energization is divided into a first stage T1$a$ when the output voltage "E/2" of the voltage source 42 is applied in the forward direction from one end to the other end of the actuator Z1 by turning on the MOS transistors S13 and S21 and a second stage T1$b$ when the output voltage "E" of the voltage source 41 is applied in the forward direction from one end to the other end of the actuator Z1 by turning on the MOS transistors S12 and S21. At the first stage T1$a$, as indicated by an arrow in FIG. 3, the electric charge "Q/2" flows out from the voltage source 42 and is stored in the actuator Z1. At the second stage T1$b$, as indicated by an arrow in FIG. 5, the electric charge "Q/2" flows out from the voltage source 41 and is stored in the actuator Z1.

A charging loss at the first stage T1$a$ is a value obtained by deducting energy stored in the actuator Z1 from energy supplied by the voltage source 42 and is represented by the following formula:

$$(Q/2)\cdot(E/2) - [(Q/2)\cdot(E/2)]/2 = (Q\cdot E)/8$$

A charging loss at the second stage T2$a$ is a value obtained by deducting energy added to the actuator Z1 from energy supplied by the voltage source 41 and is represented by the following formula:

$$(Q/2)\cdot E - \{(Q\cdot E)/2 - [(Q/2)\cdot(E/2)]/2\} = Q\cdot E/8$$

Thereafter, the voltage "E" of the actuator Z1 is held in order to maintain a deformed state of the actuator Z1 for a while until a phase of ink pressure reaches a predetermined stage. The voltage "E" may be held by keeping the MOS transistors S12 and S21 on or may be performed by turning off one of the MOS transistors S12 and S21 or turning off both the MOS transistors S12 and S21.

Figure 6:
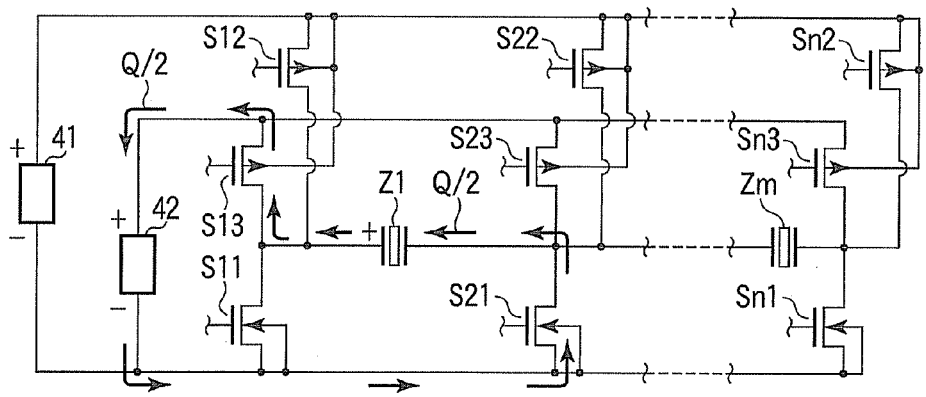
FIG. 6 is a circuit diagram showing path in the first stage of discharging according to the first embodiment.
Figure 7:
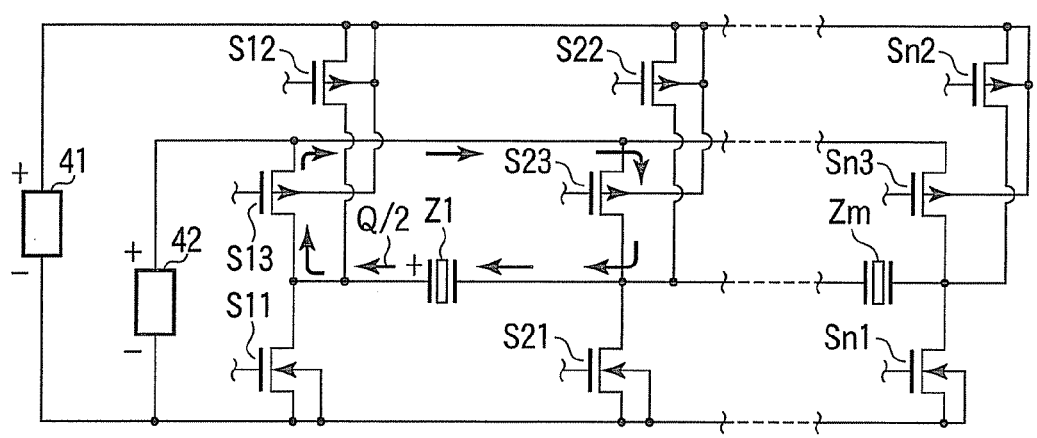
FIG. 7 is a circuit diagram showing path in the second stage of discharging according to the first embodiment.

The next discharging period T2 is divided into a first stage T2$a$ when the actuator Z1 is discharged by turning on the MOS transistors S13 and S21 and a second stage T2$b$ when the actuator Z1 is discharged by turning on the MOS transistors S13 and S23. At the first stage T2$a$, as indicated by an arrow in FIG. 6, the electric charge "Q/2", which is the half of the change stored in the actuator Z1, is returned to the voltage source 42. At the second stage T2$b$, as indicated by an arrow in FIG. 7, the electric charge "Q/2" is looped and discharged via a path not passing through a voltage source, i.e., a discharging path. At this point, the remaining electric charge "Q/2" stored in the actuator Z1 is discharged and energy corresponding to the electric charge "Q/2" is consumed by resistance components on the discharging path. Consequently, the voltage of the actuator Z1 decreases to zero.

A discharging loss at the first stage T2$a$ is a value obtained by deducting energy returned to the voltage source 42 from energy extracted from the actuator Z1 and is represented by the following formula:

$$\{(Q\cdot E)/2 - [(Q/2)\cdot(E/2)]/2\} - [(Q/2)\cdot(E/2)] = (Q\cdot E)/8$$

A discharging loss at the second stage T2b is energy remaining in the actuator Z1 and is represented by the following formula:

$$[(Q/2)\cdot(E/2)]/2=(Q\cdot E)/8$$

The voltage source 41 discharges the electric charge "Q/2" at the first stage T1a of the charging period T1. That is, the voltage source 41 supplies energy of "(Q·E)/2". The energy "(Q·E)/2" is equal to total energy "[(Q·E)/8]·4" consumed by the driving device at all the stages T1a, T1b, T2a, and T2b of the charging period T1 and the discharging period T2.

The voltage source 42 discharges the electric charge "Q/2" at the first stage T1a of the charging period T1. However, since the voltage source 42 receives the electric charge "Q/2" at the first stage T2a of the discharging period T2, the voltage source 42 does not supplies power. This means that the voltage source 42 only has to have an electricity storing function and a small-capacity supply ability enough for correcting a slight shift of electric charge. In other words, the voltage source 42 does not need to be a so-called "power supply". This is an important characteristic of the present invention.

An essential condition for enjoying this characteristic is the following (1):

(1) 'A difference "E−(E/2)=E/2" between the voltage "E/2" of the voltage source 42 and the reached voltage "E" during the charging of the actuator Z1' is equal to 'a difference "(E/2)−0=E/2" between the voltage "E/2" of the voltage source 42 and initial or after-discharge voltage "0" of the actuator Z1'.

When this condition is satisfied, electric charge input to and electric charge output from the voltage source 42 during the charging and during the discharging are equal. As a result, power consumption of the voltage source 42 is substantially zero. Therefore, concerning the adoption of the voltage source 42, the problems of power consumption and heat generation do not occur. Since the power consumption of the voltage source 42 is substantially zero, power consumed by the driving device can be regarded as only the power consumption of the voltage source 41.

The charging period T3 by the backward energization is divided into a first stage T3a when the output voltage "E/2" of the voltage source 42 is applied in the backward direction from the other end to one end of the actuator Z1 by turning on the MOS transistors S23 and S11 and a second stage T3b when the output voltage "E" of the voltage source 41 is applied in the backward direction from the other end to one end of the actuator Z1 by turning on the MOS transistors S22 and S11. At the first stage T3a, the electric charge "Q/2" flows out from the voltage source 42 and energy stored in the actuator Z1. At the second stage T3b, the electric charge "Q/2" flows out from the voltage source 41 and energy stored in the actuator Z1.

The discharging period T4 is divided into a first stage T4a when the actuator Z1 is discharged by turning on the MOS transistors S23 and S11 and a second stage T4b when the actuator Z1 is discharged by turning on the MOS transistors S23 and S13. At the first stage T4a, the electric charge "Q/2", which is the half of the charge stored in the actuator Z1, is returned to the voltage source 42. At the second stage T4b, the remaining electric charge "Q/2" stored in the actuator Z1 is consumed by resistance components on the discharging path.

A second embodiment of the present invention is explained below. In the drawings referred to below, components same as those in the first embodiment are denoted by the same reference numerals and signs and explanation of the components is omitted.

Figure 8:
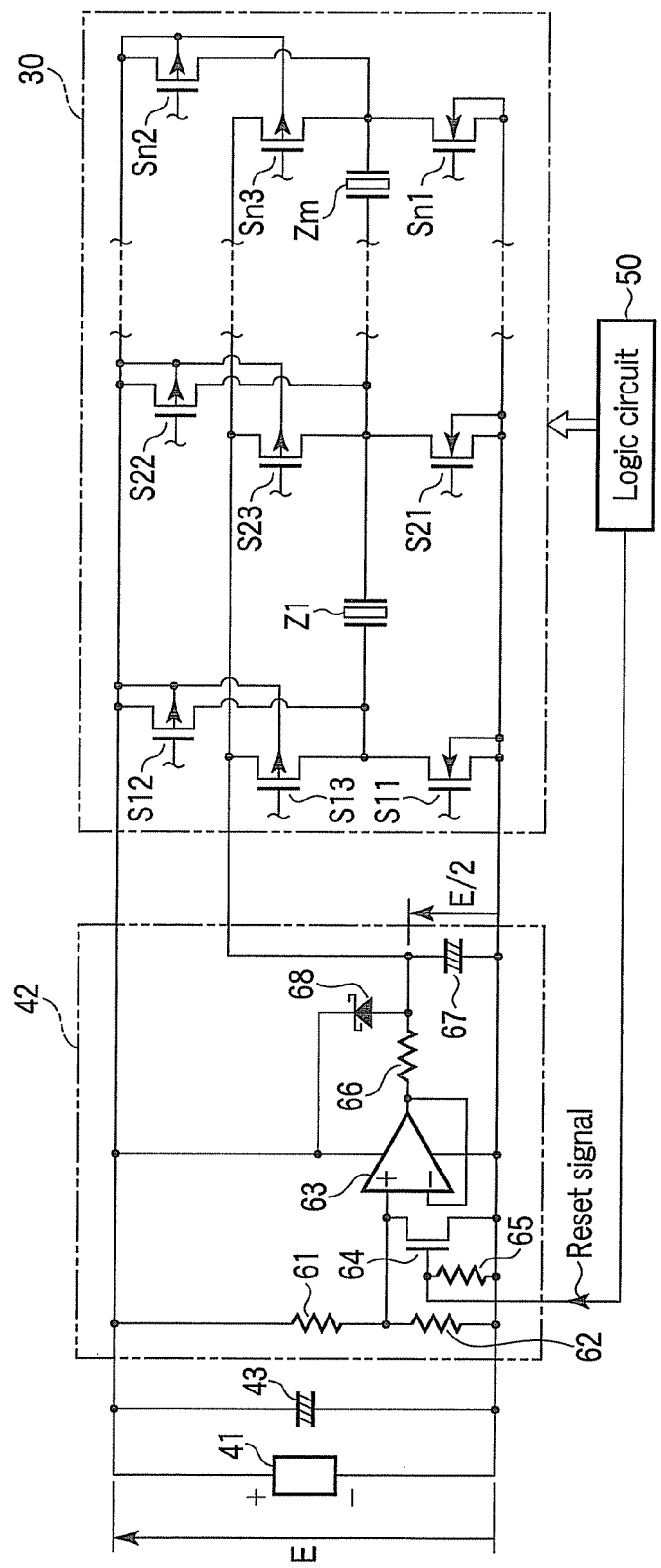
FIG. 8 is a circuit diagram of a driving device according to the second embodiment of the present invention.

As shown in FIG. 8, a smoothing capacitor 43 is connected in parallel to the voltage source 41. The voltage source 42 includes a series circuit (a voltage dividing circuit) of resistors 61 and 62 connected to both the ends of the voltage source 41, an operational amplifier 63 that has power supply terminals connected to both the ends of the voltage source 41 and amplifies, with a gain "1", voltage divided by the series circuit of the resistors 61 and 62, a MOS transistor 64 that has source to drain connected between a positive side input terminal of the operational amplifier 63 and the ground line, a resistor 65 connected between a gate of the MOS transistor 64 and the ground line, a smoothing capacitor 67 connected between an output terminal of the operational amplifier 63 and the ground line via a resistor 66, and a shot key barrier diode (SBD) 68 connected between an interconnection point of the resistor 66 and the smoothing capacitor 67 and the positive side terminal of the power supply 41. The smoothing capacitor 67 has an electricity storing function.

A reset signal is supplied to a gate of the MOS transistor 64 from the logic circuit 50. When the reset signal is at a low level "L" (not resetting), the MOS transistor 64 is turned off, the voltage of the resistor 62 is amplified by the operational amplifier 63, and the voltage "E/2" is output from the operational amplifier 63. A function of the operational amplifier 63 is a voltage follower circuit that buffers, with a gain "1", the voltage of the resistor 62 serving as a reference voltage source. The resistance of the resistor 61 and the resistor 62 is the same. That is, the reference voltage is E/2.

The output voltage "E/2" is charged in the smoothing capacitor 67. The voltage "E/2" generated in the smoothing capacitor 67 is an output voltage of the voltage source 42. When the reset signal changes to a high level "H", the MOS transistor 64 is turned on and the potential at the positive side input terminal of the operational amplifier 63 decreases to zero. In this case, the output voltage of the operational amplifier 63 decreases to zero and the electric charge stored in the smoothing capacitor 67 is discharged via the resistor 66. When the discharging ends, the voltage of the smoothing capacitor 67 decreases to zero.

The resistor 66 is a current limiting unit that limits the output current of the operational amplifier 63 not to be excessively large in charging and discharging of the smoothing capacitor 67 and the actuator Z1. The resistor 66 is a resistor for allowing slight temporal fluctuation for the output voltage "E/2" of the voltage source 42. A time constant of a circuit including the resistor 66 and the smoothing capacitor 67 is set long compared with energization time of the actuator Z1. In the case of a high-speed ink jet head, a period of the forward energization including the charging period T1 (shown in FIG. 4) is time of few microseconds. On the other hand, a time constant of a circuit including the resistor 66 and the smoothing capacitor 67 is set to, for example, several milliseconds. The time constants are set in this way in order to prevent the operational amplifier 63 from reacting following the charging and discharging.

By allowing the slight temporal fluctuation for the output voltage "E/2" of the voltage source 42 in this way, it is possible to prevent the operational amplifier 63 from consuming useless power to correct slight voltage fluctuation. Electric charge stored in the smoothing capacitor 67 is used for instantaneous supply of electric charge. To reduce voltage fluctuation at this point, the capacity of the smoothing capacitor 67 should simply be increased. The required function of the resistor 66 is limiting electric current for the operational amplifier 63 to charge and discharge the smoothing capacitor 67. Therefore, for example, a constant current circuit may be used instead of the resistor 66. The constant current circuit may be incorporated in the operational amplifier 63.

When the operation of the driving device is stopped, the logic circuit 50 sets the reset signal to the high level "H" and quickly discharges residual electric charge of the smoothing capacitor 67. Consequently, when the operation is stopped at power down, output voltage of the voltage source 42 is controlled not to be higher than the output voltage of the voltage source 41. The shot key barrier diode 68 is also protecting means for preventing, output voltage of the voltage source 42 to be higher than the output voltage of the voltage source 41 at power down. Only one of these protecting means may be provided. The protecting means only have to be provided as required. In embodiments explained below, the description about the protecting means is omitted. However, the protecting means can be added according to the same idea.

Figure 1:
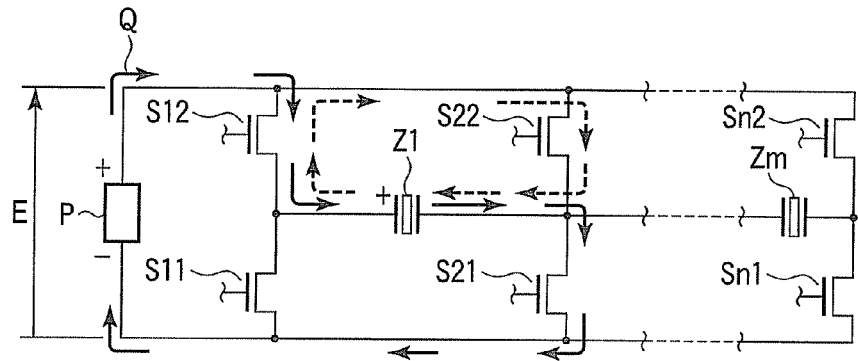
FIG. 1 is a circuit diagram of a device in the past.
Figure 2:
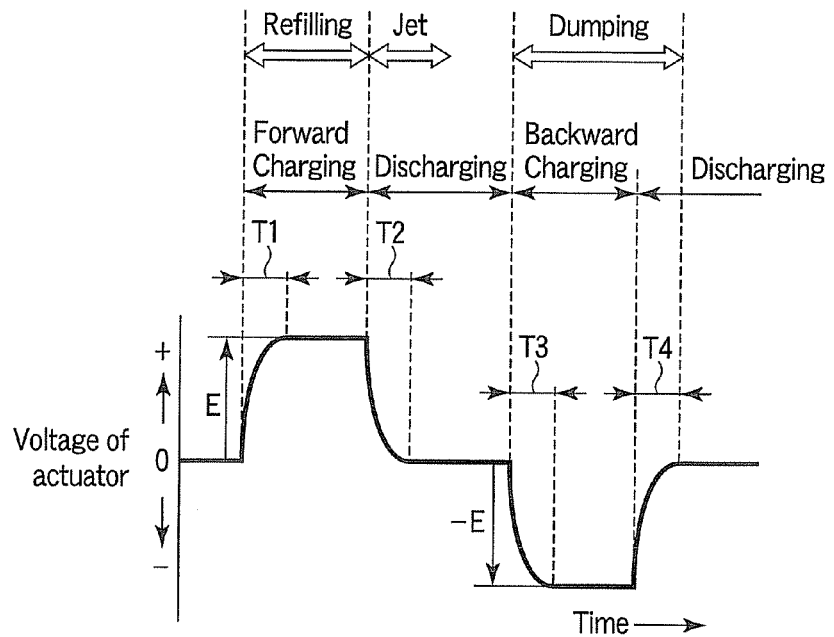
FIG. 2 is a circuit diagram of a voltage waveform of actuators shown in FIG. 1.

In the case of the driving device in the past shown in FIG. 1 explained first, the energy consumption in the period from the charging to the discharging of the actuator is "Q·E". However, in the case of the second embodiment, as in the first embodiment, the energy consumption in the period from the charging to the discharging of the actuator Z1 is "(Q·E)/2" half as large as that in the past. If holding times at the stages of the charging period T1, the discharging period T2, the charging period T3, and the discharging period T4 are set to time sufficient for charging and set to time sufficiently short compared with a pressure oscillation period of the actuator Z1, the operation of ink jet is the same as that in the past.

Other components, actions, and effects are the same as those in the first embodiment.

A third embodiment of the present invention is explained below. In the drawings referred to below, components same as those in the first and second embodiments are denoted by the same reference numerals and signs and explanation of the components is omitted.

Before explaining the operation of the third embodiment, first, charge pump operation during discharging of the actuator Z1 related to reliability secured when the driving device shown in FIG. 3 or 8 is integrated-circuited is explained.

As in the first and second embodiment, when charging and discharging of the actuator Z1 is performed by a method of controlling forward energization and backward energization, voltage during discharging may exceed a range of the potential of the output of the voltage source 41 on a positive side or a negative side. This operation is called charge pump operation.

In general, in a semiconductor integrated circuit, highest potential of a positive side line is given to a back gate of a P-channel MOS transistor and lowest potential (zero potential) of a ground line is given to a back gate of an N-channel MOS transistor. One of the highest potential and the lowest potential is set as potential of a substrate of the semiconductor integrated circuit. A reverse bias is applied to PN junction between the substrate and back gates of the MOS transistors and elements in the semiconductor integrated circuit. Consequently, the elements in the semiconductor integrated circuit are electrically insulated from the substrate or the back gates of the MOS transistors.

However, if high-level voltage on a positive side or a negative side exceeding a range of the highest potential to the lowest potential is applied to any one of the elements in the semiconductor integrated circuit and, moreover, if the applied voltage exceeding the range is larger than forward direction voltage "Vf" of the PN junction (about 0.6 V in a silicon semiconductor), electric current flows between the substrate or the back gates of the MOS transistors and the elements in the semiconductor integrated circuit, which originally need be insulated from each other. This electric current actuates parasitic transistors parasitic in various places of the semiconductor integrated circuit, causes malfunction and latch-up, and deteriorates reliability of the semiconductor integrated circuit.

In the third embodiment, such deterioration in reliability is prevented.

The high-level voltage on the positive side or the negative side caused by the charge pump operation occurs when electric charge stored in the actuator Z1 is discharged. An example of the occurrence of the peak voltage and the effect of the current embodiment for this issue is explained with reference to the first stage T2a and the second stage T2b in the discharging period T2 shown in FIG. 4.

At the starting point of the second stage T2b, the voltage of the actuator Z1 already have fallen to "E/2". Discharging operation at this point is performed in a loop including the positive side terminal of the voltage source 42 having the voltage "E/2". Therefore, voltage generated by the charge pump operation does not exceed the range of voltage "0" to "E".

This action is an effect obtained by performing final discharging using a transistor connected to intermediate potential according to the configuration of the present invention and is one of advantages of the present invention.

However, at the starting point of the first stage T2a in the discharging period T2, the drain voltage of the N-channel MOS transistor S21 is swung to a negative level. When peak current of a positive value flowing to the transistor S21 at the starting point of the first stage T2a is represented as Ip and the ON resistance of the MOS transistor S21 is represented as Rn, peak voltage Vp of a negative level applied to the drain of the MOS transistor S21 is represented by the following formula:

$$Vp = -Ip \cdot Rn$$

When the ON resistance of the P-channel MOS transistor S13 is represented as Rp and the equivalent series resistance of the actuator Z1 is represented as Rc, peak current Ip is represented by the following formula:

$$Ip = (E/2)/(Rp + Rc + Rn)$$

When the peak current Ip is substituted in the formula of the peak voltage Vp, the peak voltage Vp is represented by the following formula:

$$Vp = -(E/2) \cdot Rn/(Rp + Rc + Rn)$$

When an absolute value of the peak voltage Vp of the negative level is larger than the forward direction voltage "Vf" of the PN junction of the semiconductor, if the driving device shown in FIG. 3 or 8 is integrated-circuited, it is likely that electric current flows out from the back gates or an integrated circuit substrate to cause malfunction and latch-up. In order to prevent the likelihood of malfunction and latch-up and improve reliability of the circuit, an absolute value |Vp| of the peak voltage Vp only has to be set as small as possible. Desirably, the absolute value |Vp| is set smaller than the forward direction voltage of the PN junction, "Vf".

However, the formulas do not take into account the influence of the inductance of wiring and an inductance component of the actuator Z1. In an actual driving device, since there is the influence of an inductance component, the peak current Ip and the absolute value |Vp| are smaller and more advantageous than those of the formulas. However, it is a burden to actually calculate the inductance of the wiring and the inductance component of the actuator Z1. Therefore, the formulas are used for the following discussion. High reliability is still obtained by setting the absolute value |Vp| for the formula as small as possible.

A first term of the formula representing the peak voltage Vp is a value "E/2" half as large as the voltage "E". This is because, in this embodiment, stepwise discharging operation for once discharging to "E/2" is adopted. As a result, compared with the discharging to zero without an intermediate step, the absolute value |Vp| is small and a condition |Vp|<Vf is easily satisfied. This is also one of the advantages of the configuration of the present invention. The equivalent series resistance Rc of the actuator Z1 depends on the actuator Z1 and cannot be changed in general. Therefore, from this point of view, the ON resistance Rp of the P-channel MOS transistor S13 should be set as large as possible and the ON resistance Rn of the N-channel MOS transistor S21 is set as small as possible.

To set the ON resistance Rn small, it is necessary to increase the size of the MOS transistor S21. However, usually, the N-channel MOS transistor tends to have small ON resistance compared with the P-channel MOS transistor even if areas thereof are the same. This is also advantageous in satisfying the condition |Vp|<Ef.

To set the ON resistance Rp large, the size of the P-channel MOS transistor S13 only has to be set small. However, if the size of the MOS transistor S13 is set small and the ON resistance Rp is set large simply, it is likely that charging time for the actuator Z1 is extended and the operation of ink jet is dulled.

As measures against this problem, plural P-channel MOS transistors connected in parallel to one another only have to be adopted instead of the P-channel MOS transistor S13 and sequentially turned on. This makes it possible to set large ON resistance Rp of the MOS transistor that is turned on first.

Figure 9:
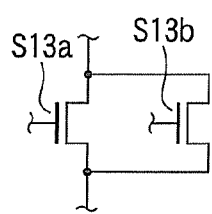
FIG. 9 is a circuit diagram of a main part according to a third embodiment of the present invention.

Specifically, as shown in FIG. 9, two P-channel MOS transistors S13a and S13b having small areas and large ON resistance Rp and connected in parallel to one another are adopted instead of the P-channel MOS transistor S13. Similarly, each of the P-channel MOS transistors S23 to Sn3 is also replaced with two P-channel MOS transistors. The operation of the MOS transistors S13a and S13b is explained below. Explanation of the operation of the MOS transistors S23 to Sn3 is omitted.

Both the MOS transistors S13a and S13b are not simultaneously turned on at timing when the MOS transistor 513 is turned on. Only one MOS transistor S13a is turned on first and, after the peak current IP decreases, the other MOS transistor S13b is additionally turned on.

The two MOS transistors S13a and S13b are turned on in order one by one. Consequently, the peak current Ip and the peak voltage Vp of the negative level generated by the peak current Ip are divided into a peak at the time when the MOS transistor S13a is turned on and a peak at the time when the MOS transistor S13b is turned on. Levels of the peaks can be reduced.

Figure 10:
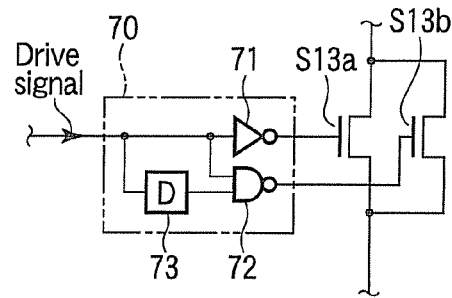
FIG. 10 is a circuit diagram of a delay control circuit according to the third embodiment.

As means for turning on the two MOS transistors S13a and S13b in order one by one, a delay control circuit 70 shown in FIG. 10 is adopted. The delay control circuit 70 includes an inverter 71 for inverting a level of a drive signal from the logic circuit 50 and supplying the drive signal to the MOS transistor S13a, a delay circuit 73 that delays the drive signal from the logic circuit 50 by time of, for example, about 50 nanoseconds, and a NAND gate 72 that supplies the drive signal from the logic circuit 50 to the MOS transistor S13b according to the output of the delay circuit 73. The Drive signal is "Active High". The Pch MOS transistors S13a and S13b turns ON when its Gate terminal is "Low".

It is advisable to set a ratio of ON resistances Rp of the MOS transistors S13a and S13b (an inverse ratio of transistor areas) such that larger one of a peak voltage at the time when the MOS transistor S13a is turned on and a peak voltage at the time when the MOS transistor S13b is turned on is as small as possible, i.e., the levels of the two peak voltages are the same. According to this setting, the ON resistance Rp of the MOS transistor S13a is normally larger than the ON resistance Rp of the MOS transistor S13b. This method is explained in detail in JP-A-2002-94364 of the inventor.

As another method, the ON resistance of the MOS transistor S13a is set larger than the ON resistance of the MOS transistor S13b. A sequence for turning on only the MOS transistor S13a and turning off the MOS transistor S13b first, turning off the MOS transistor S13a and turning on the MOS transistor S13b next, and finally turning on both the MOS transistors S13a and S13b is adopted. Then, three peaks of the current peak Ip and the voltage peak Vp are formed. As a result, the ON resistance Rp of the MOS transistor S13a turned on first can be set larger and the current peak Ip and the voltage peak Vp can be set smaller.

Figure 11:
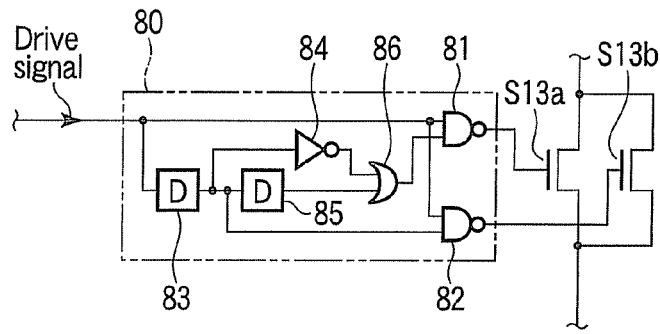
FIG. 11 is a circuit diagram of a modification of the delay control circuit according to the third embodiment.

In this method, a delay control circuit 80 shown in FIG. 11 is adopted. The delay control circuit 80 includes a NAND gate 81 for supplying a drive signal to the MOS transistor S13a, a NAND gate 82 for supplying a drive signal to the MOS transistor S13b, a delay circuit 83 that delays a drive signal from the logic circuit 50 by a predetermined time, an inverter 84 that inverts a level of a drive signal output from the delay circuit 83, a delay circuit 85 that further delays the drive signal output from the delay circuit 83 by a predetermined time, and an OR gate 86 that is input with the drive signal output from the delay circuit 85 and the drive signal output from the inverter 84. The drive signal from the logic circuit 50 and an output signal of the OR gate 86 are input to the NAND gate 81. The drive signal from the logic circuit 50 and the drive signal output from the delay circuit 83 are input to the NAND gate 82.

Other components, actions, and effects are the same as those in the first embodiment.

A fourth embodiment of the present invention is explained below. In the drawings referred to below, components same as those in the first to third embodiments are denoted by the same reference numerals and signs and explanation of the components is omitted.

Figure 12:
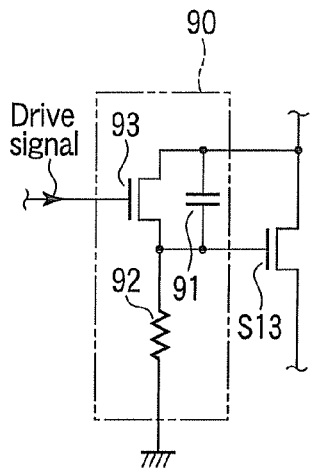
FIG. 12 is a circuit diagram of a main part according to a fourth embodiment of the present invention.

Instead of replacing the P-channel MOS transistor S13 (and the MOS transistors S23 to Sn2) with the two MOS transistors S13a and S13b, as shown in FIG. 12, a drive signal from the logic circuit 50 is supplied to the MOS transistor S13 via a time constant circuit 90. Time constant circuits 90 are also provided for the other P-channel MOS transistors S23 to Sn3. The operation of the MOS transistor S13 is explained below. Explanation of the operation of the other MOS transistors S23 to Sn2 is omitted.

The time constant circuit 90 includes a capacitor 91, a resistor 92, and a Pch MOS transistor 93. In an ON period of the MOS transistor S13, first, the gate voltage of the MOS transistor S13 is controlled to increase the ON resistance Rp of the MOS transistor S13 and, thereafter, the gate voltage of the MOS transistor S13 is controlled to reduce the ON resistance Rp of the MOS transistor S13.

This makes it possible to set absolute values of the peak current Ip and the peak voltage Vp small at the time when the MOS transistor S13a is turned on.

Other components, actions, and effects are the same as those in the first embodiment.

A fifth embodiment of the present invention is explained below. In the drawings referred to below, components same as those in the first to fourth embodiments are denoted by the same reference numerals and signs and explanation of the components is omitted.

Figure 13:
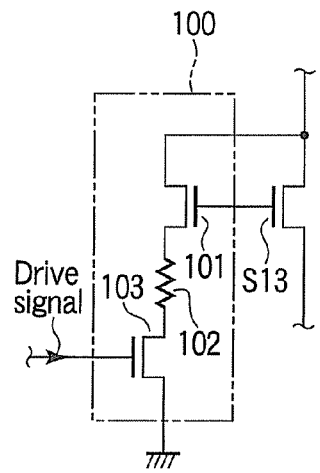
FIG. 13 is a circuit diagram of a main part according to a fifth embodiment of the present invention.

Instead of replacing the P-channel MOS transistor S13 (and the MOS transistors S23 to Sn3) with the two MOS transistors S13a and 13B, as shown in FIG. 13, a drive signal from the logic circuit 50 is supplied to the MOS transistor S13 via a constant current control circuit (a current mirror circuit) 100. Constant current control circuits 100 are also provided for the other P-channel MOS transistors S23 to Sn3. The operation of the MOS transistor S13 is explained below. Explanation of the operation of the other MOS transistors S23 to Sn2 is omitted.

The constant current control circuit 100 includes a MOS transistor 101, a Pch MOS transistor 101, a resistor 102, and a Nch transistor 103. In the ON period of the MOS transistor S13, the constant current control circuit 100 limits a maximum value of electric current flowing to the MOS transistor 513.

Other components, actions, and effects are the same as those in the first embodiment.

A sixth embodiment of the present invention is explained below. In the drawings referred to below, components same as those in the first to fifth embodiments are denoted by the same reference numerals and signs and explanation of the components is omitted.

Figure 14:
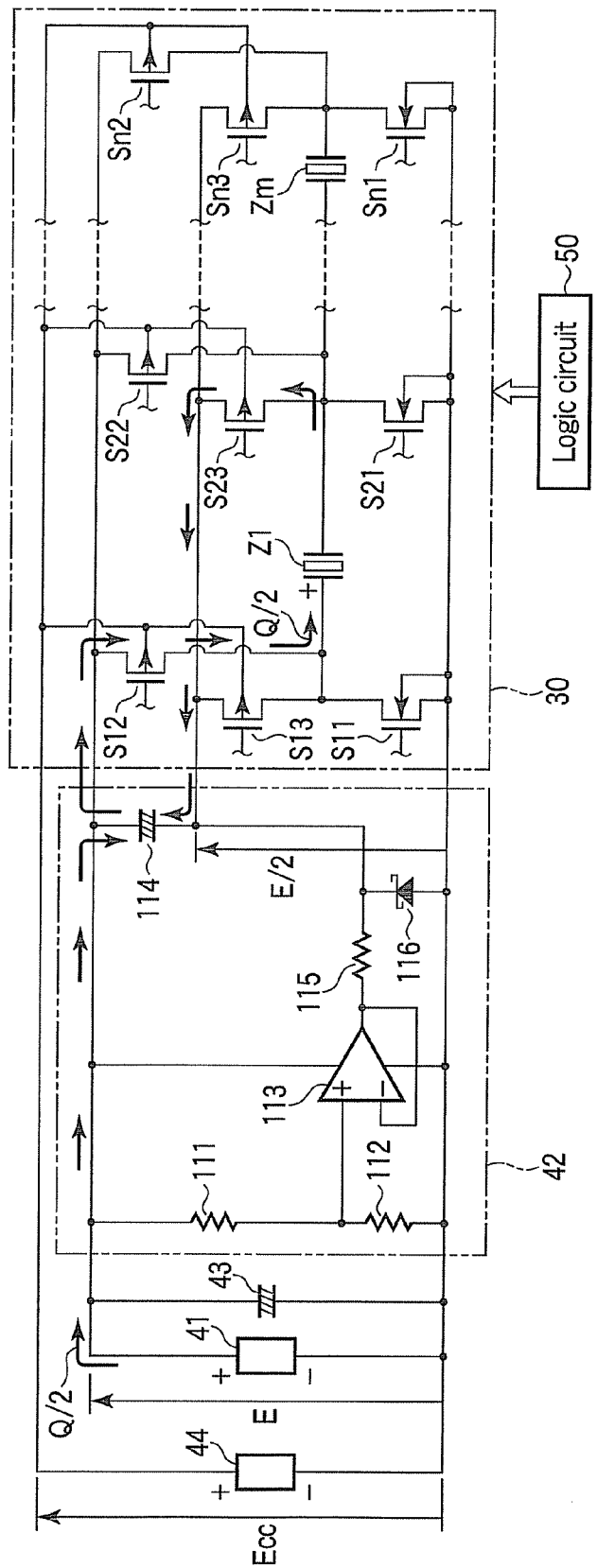
FIG. 14 is a circuit diagram showing path in a first stage of charging according to a sixth embodiment of the present invention.

As shown in FIG. 14, the smoothing capacitor 43 is connected in parallel to the voltage source 41. The voltage source 42 includes a series circuit (a voltage dividing circuit) of resistors 111 and 112 connected to both the ends of the voltage source 41, an operational amplifier 113 that has a power supply terminal connected to both the ends of the voltage source 41 and amplifies, with a gain "1", voltage generated in the resistor 112, a series circuit of a smoothing capacitor 114 and a resistor 115 connected between the positive side terminal of the voltage source 41 and an output terminal of the operational amplifier 113, and a shot key barrier diode 116 connected between an interconnection point of the smoothing capacitor 114 and the resistor 115 and the ground line. The smoothing capacitor 114 has an electricity storing function. The resistance of the resistor 111 and the resistor 112 are the same. That is, the reference voltage of the operational amplifier 113 is "E/2", and output of the operational amplifier 113 is also "E/2". The voltage of the interconnection point of the smoothing capacitor 114 and the resistor 115 is also "E/2" in the steady state. It is the output voltage of the voltage source 42. The output voltage "E/2" is obtained with reference to the output voltage "E" of the voltage source 41 unlike the output voltage "E/2" obtained with reference to the zero potential of the ground line as shown in FIG. 8.

A third voltage source 44 that outputs DC voltage "Ecc" is provided. The back gates of the P-channel MOS transistors S12, S13, S22, S23, . . . , Sn2, and Sn3 are connected to a positive side output terminal of the voltage source 44. A negative side output terminal of the voltage source 44 is connected to the ground line.

The charging at the first stage T1a in the charging period T1 is performed by turning on the MOS transistors S12 and S23 as indicated by an arrow in FIG. 14. The charging at the second stage T1b is performed by turning on the MOS transistors S12 and S21 as indicated by an arrow in FIG. 15.

Figure 16:
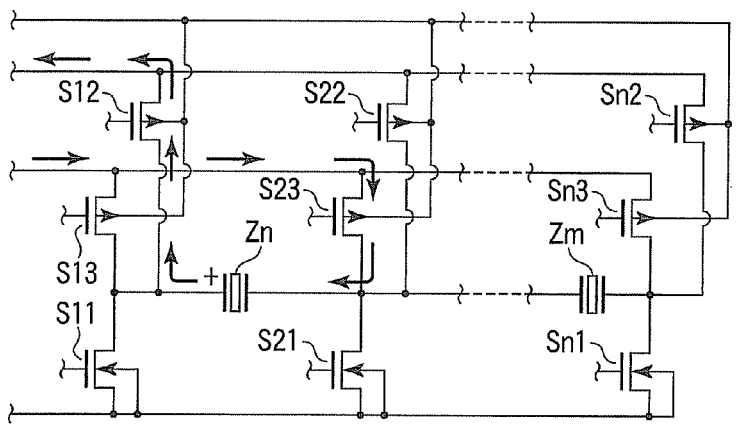
FIG. 16 is a circuit diagram showing path in a first stage of discharging according to the sixth embodiment.

The discharging at the first stage T2a in the discharging period T2 is performed by turning on the MOS transistors S12 and S23 as indicated by an arrow in FIG. 16. As indicated by arrows in FIG. 17, the discharging at the second stage T2b in the discharging period T2 is performed by turning on the MOS transistors S13 and S23.

In particular, in the discharging at the first stage T2a in the discharging period T2 (FIG. 16), the MOS transistors S12 and S23 are turned on and the MOS transistor S21 is not turned on. Since the MOS transistor S21 is not turned on, the drain of the MOS transistor S21 does not have negative potential. Since the peak current Ip flows to the MOS transistor S12, positive peak voltage Vp is generated at the drain of the MOS transistor S12 with reference to the voltage "E". In other words, the drain voltage of the MOS transistor S12 is "E+Vp".

When the ON resistance of the P-channel MOS transistor S12 is represented as Rn12, the ON resistance of the P-channel MOS transistor S23 is represented as Rn23, and the equivalent series resistance of the actuator Z1 is represented as Rc, the peak voltage Vp is represented by the following formula:

$$Vp=[(E/2) \cdot Rn12]/[Rn23+Rc+Rn12]$$

The peak voltage Vp is larger as a total of the equivalent series resistance Rc of the actuator Z1 and the ON resistance Rn23 of the MOS transistor 523 is smaller. The peak voltage Vp is smaller as the ON resistance Rn12 of the MS transistor S12 is smaller. When the inductance component of the actuator Z1 and the inductance component of the wiring are large, the peak voltage Vp is smaller than a value of the above formula.

The level of the peak voltage Vp is proportional to the difference "E/2" between the charging voltage "E" at the second stage T1b in the charging period T1 and the voltage "E/2" at the end point of the first stage T2a in the discharging period T2 after that. This is because, in this embodiment, the stepwise discharging operation for once discharging to "E/2" and subsequently discharging to zero is adopted instead of discharging to zero without an intermediate step.

The level of the output voltage "Ecc" of the voltage source 44, to which the back gates of the P-channel MOS transistors S12, S13, S22, S23, . . . , Sn2, and Sn3 are connected, is higher than that of the output voltage "E" of the voltage source 41. The output voltage "Ecc" is selected according to a condition of the following formula:

$$Ecc \geq E+Vp+Vf$$

According to the selection, it is possible to prevent a deficiency in that the back gates of the MOS transistors S12, S13, S22, S23, . . . , Sn2, and Sn3 are sequentially biased and electric current flows to the back gates. Therefore, it is possible to improve reliability of the integrated circuit.

An upper limit of the voltage "Ecc" is limited by the withstanding voltage of the integrated circuit. In order to gain the driving speed and the amplitude of the actuator Z1, there is a request for increasing the output voltage "E" of the voltage source 41 as the driving voltage. To increase the output voltage "E" of the voltage source 41 while the output voltage "ECC" of the voltage source 44 is kept constant, it is desirable to set the peak voltage Vp as small as possible.

In this embodiment, since a proportional coefficient of the peak voltage Vp is proportional to "E/2" rather than "E", the peak voltage Vp is smaller than that in the past and is advantageous. This is one of the advantages of the configuration of the present invention.

Other components, actions, and effects are the same as those in the first embodiment.

A seventh embodiment of the present invention is explained below. In the drawings referred to below, components same as those in the first to sixth embodiments are denoted by the same reference numerals and signs and explanation of the components is omitted.

In the embodiments, one or both of the time of the first stage T1a in the charging period T1 and the time of the first stage T2a in the discharging period T2 can be adjusted.

In an ink jet head having plural actuators, if different times are selected among the actuators as the time(s) of one or both of the first stage T1a and the first stage T2a, the actuators can be driven in different manners. For example, when the times of the first stage T1a and the first stage T2a of the actuator related to a certain channel are set longer than those of other channels, a pressure change for ink jet is dulled. Therefore, in the channel related to the actuator, a jet volume and jet speed fall compared with those of the other channels. It is possible to select the first stage T1a and the first stage T2a to correct differences in the jet volume and the jet speed due to characteristic differences among the actuators, the channels, and nozzles. This makes it possible uniformalize ink jet characteristics.

Figure 15:
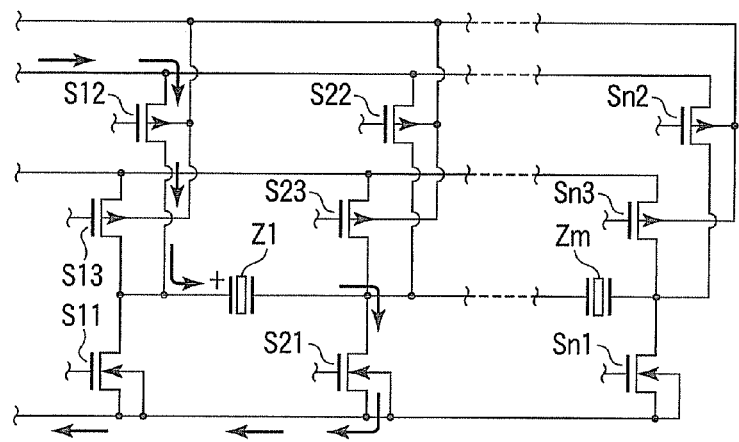
FIG. 15 is a circuit diagram showing path in a second stage of charging according to the sixth embodiment.

To adjust the time of the first stage T1a and the time of the first stage T2a, ON and OFF timing for the MOS transistors only has to be adjusted. For example, in the case of the driving device shown in FIG. 14, if ON timing for the MOS transistor S21 shown in FIG. 15 is delayed, the time of the first stage T1a is extended as shown in FIG. 18. If OFF timing for the MOS transistor S21 and ON timing for the MOS transistor S23 shown in FIG. 16 are advanced, the time of the second stage T2a is extended as shown in FIG. 18. Since this method can be controlled by a digital circuit, the method is easy to control and effective.

Other components, actions, and effects are the same as those in the first embodiment.

An eighth embodiment of the present invention is explained below. In the drawings referred to below, components same as those in the first to seventh embodiments are denoted by the same reference numerals and signs and explanation of the components is omitted.

In the driving device shown in FIG. 8 explained as the second embodiment, the output voltage of the voltage source 42 is set to "E/2" such that electric charge input to and electric charge output from the voltage source 42 are equal. According to feedback, the operational amplifier 63 sources electric current if the output voltage of the voltage source 42 is smaller than "E/2" and sinks electric current if the output voltage of the voltage source 42 is larger than "E/2" to maintain the output voltage of the voltage source 42 at "E/2". In other words, both functions of current source and current sink are necessary for the operational amplifier 63. Therefore, usually, an output stage of the operational amplifier 63 needs to have a push pull configuration.

In this embodiment, the resistance R1 of the resistor 61 and the resistance R2 of the resistor 62 are not set the same and the resistance R2 is set slightly larger than the resistance R1, whereby the output voltage of the voltage source 42 is shifted to a value slightly larger than "E/2", for example, "0.51·E". Then, electric charge flowing out from the voltage source 42 at the first stage T1a of the charging period T1 is slightly larger than electric charge flowing into the voltage source 42 at the first stage T2a of the discharging period T2. In this case, if the operational amplifier 63 does not operate, the voltage of the smoothing capacitor 67 gradually rises.

However, the operational amplifier 63 acts in a direction for steadily allowing electric charge to escape to the ground line, i.e., a sink direction and adjusts the magnitude of electric current according to feedback. Consequently, the output voltage of the voltage source 42 is maintained at "0.51·E". In other words, the operational amplifier 63 may be a single end output having only the current sink function. In a simplest form, an emitter follower of a PNP-type transistor can be used instead of the operational amplifier 63. In the case of using the Emitter follower circuit of the PNP transistor instead of the operational amplifier 63, Base of the PNP transistor should be connected between an interconnection point of resistor 61 and resistor 62, Corrector of the PNP transistor should be connected to the ground line, and Emitter of the PNP transistor should be connected to the resistor 66 instead of the operational amplifier 63. The ratio of R1:R2 should be modified to compensate the Base-Emitter voltage of the PNP transistor.

Conversely, if the resistance R2 is set slightly smaller than the resistance R1, the operational amplifier 63 may be a single end output having only the current source function. In a simplest configuration, an emitter follower of an NPN-type transistor can be used instead of the operational amplifier 63. In the case of using the Emitter follower circuit of the NPN transistor instead of the operational amplifier 63, Base of the NPN transistor should be connected between an interconnection point of resistor 61 and resistor 62, Corrector of the NPN transistor should be connected to the voltage "E" of the voltage source 41, and Emitter of the NPN transistor should be connected to the resistor 66 instead of the operational amplifier 63. The ratio of R1:R2 should be modified to compensate the Base-Emitter voltage of the NPN transistor In this way, if electric charge flowing out from the voltage source 42 during charging and electric charge flowing into the voltage source 42 during discharging are slightly unbalanced, although current consumption increases a little, there is an advantage that a configuration of the driving device can be simplified.

Other components, actions, and effects are the same as those in the first embodiment.

A ninth embodiment of the present invention is explained below. In the drawings referred to below, components same as those in the first to eighth embodiments are denoted by the same reference numerals and signs and explanation of the components is omitted.

In the embodiments, the voltages of the two stage levels, i.e., the voltage "E" of the voltage source 41 and the voltage "E/2" of the voltage source 42 are sequentially charged to the actuator Z1. If the voltages to be charged are increased to three stages "E", "2E/3", and "E/3", the peak current Ip and the peak voltage Vp can be further reduced. This makes it possible to realize a reduction in noise and improvement of reliability and reduce a charging and discharging loss.

As shown in FIG. 19, the smoothing capacitor 43 for electricity storage is connected in parallel to the voltage source 41. The voltage source 42 includes a series circuit (a voltage dividing circuit) of resistors 121, 122, and 123 connected to both the ends of the voltage source 41, an operational amplifier (a voltage follower circuit) 124 that amplifies, with a gain "1", voltage generated in a series circuit of the resistors 122 and 123, a smoothing capacitor 126 (hereinafter referred to as intermediate voltage source 126) to which output voltage "2E/3" of the operational amplifier 124 is applied via a resistor 125, an operational amplifier (a voltage follower circuit) 127 that amplifies, with a gain "1", voltage generated in the resistor 123, and a smoothing capacitor (hereinafter referred to as intermediate voltage source) 129 to which the output voltage of the operational amplifier 127 is applied via a resistor 128. The voltage "2E/3" is stored in the intermediate voltage source 126 and the voltage "E/3" is stored in the intermediate voltage source 129. A relation among the resistances R1, R2, and R3 of the resistors 121, 122, and 123 is R1=R2=R3.

The voltage "E" of the voltage source 41 is applied to the series circuit of the MOS transistors S12 and S11, the series circuit of the MOS transistors S22 and S21, . . . , and the series circuit of the MOS transistors Sn2 and Sn1 of the charging and discharging circuit 30. The voltage "2E/3" of the intermediate voltage source 126 is applied to the series circuit of the MOS transistor S13 and S11, the series circuit of the MOS transistors S23 and S21, . . . , and the series circuit of the MOS transistors Sn3 and Sn1 of the charging and discharging circuit 30. The voltage "E/3" of the intermediate voltage source 129 is applied to the series circuit of the MOS transistors S14 and S11, the series circuit of the MOS transistors S24 and S21, . . . , and the series circuit of the MOS transistors Sn4 and Sn1 of the charging and discharging circuit 30.

As a first stage of the charging period T1 by the forward energization, as indicated by an arrow in FIG. 19, the voltage "E/3" of the intermediate voltage source 129 is applied to the actuator Z1 in the forward direction by turning on the MOS transistors S14 and S21. At this point, electric charge "Q/3" flows out from the intermediate voltage source 129 and is stored in the actuator Z1.

Subsequently, as a second stage of the charging period T1, as indicated by an arrow in FIG. 20, the voltage "2E/3" of the intermediate voltage source 126 is applied to the actuator Z1 in the forward direction by turning on the MOS transistors S13 and S21. At this point, the electric charge "Q/3" flows out from the intermediate voltage source 126 and is additionally stored in the actuator Z1.

As a third stage of the charging period T1, as indicated by an arrow in FIG. 21, the voltage "E" of the voltage source 41 is applied to the actuator Z1 in the forward direction by turning on the MOS transistors S12 and S21. At this point, the electric charge "Q/3" flows out from the voltage source 41 and is additionally stored in the actuator Z1.

A discharging operation is explained below.

As a first stage of the discharging period T2, as indicated by an arrow in FIG. 22, the actuator Z1 is discharged by turning on the MOS transistors S13 and S21. At this point, "Q/3" of the electric charge stored in the actuator Z1 returns to the intermediate voltage source 126.

Figure 23:
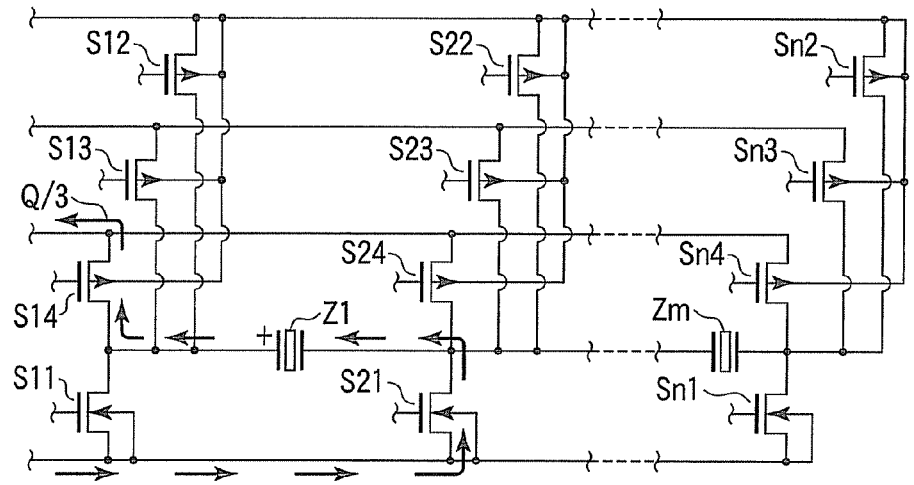
FIG. 23 is a circuit diagram showing path in a second stage of discharging according to the ninth embodiment.

Subsequently, as a second stage of the discharging period T2, as indicated by an arrow in FIG. 23, the actuator Z1 is discharged by turning on the MOS transistors S14 and S21. At this point, "Q/3" of the electric charge stored in the actuator Z1 returns to the intermediate voltage source 129.

Figure 24:
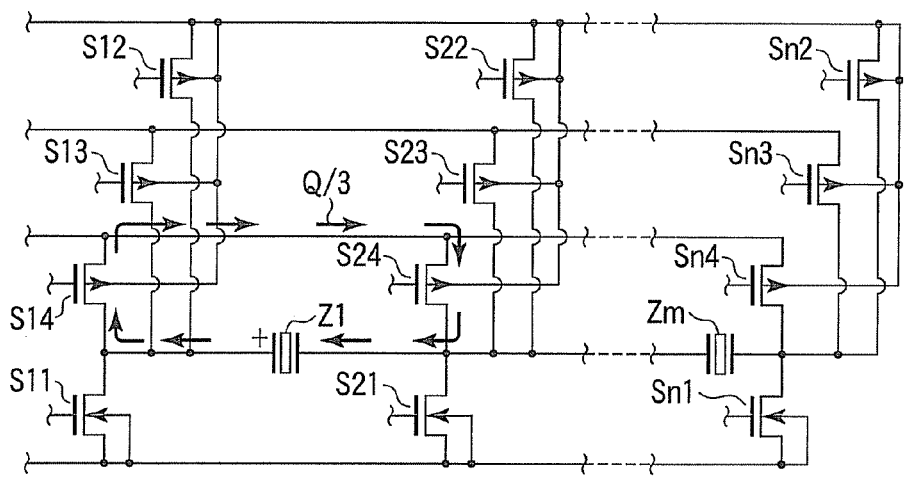
FIG. 24 is a circuit diagram showing path in a third stage of charging according to the ninth embodiment.

As a third stage of the discharging period T2, as indicated by an arrow in FIG. 24, the actuator Z1 is discharged by turning on the MOS transistors S14 and S24. At this point, the remaining electric charge "Q/3" stored in the actuator Z1 is consumed by resistance components on the discharging path. Consequently, the voltage of the actuator Z1 falls to zero.

A difference between the voltage "E" of the voltage source 41 and the voltage "2E/3" of the intermediate voltage source 126 is equal to a difference between the voltage "2E/3" of the intermediate voltage source 126 and the voltage "E/3" of the intermediate voltage source 129 and is "E/3". Therefore, electric charge input to and electric charge output from the intermediate voltage source 126 during charging and during discharging of the actuator Z1 are equal. The intermediate voltage source 126 does not consume power. A difference between the voltage "2E/3" of the intermediate voltage source 126 and the voltage "E/3" of the intermediate voltage source 129 is equal to a difference between the voltage "E/3" of the intermediate voltage source 129 and zero potential of the ground line and is "E/3". Therefore, electric charge input to and electric charge output from the intermediate voltage source 129 during charging and during discharging of the actuator Z1 are equal. The intermediate voltage source 129 does not consume power.

The voltage source 41 discharges the electric charge "Q/3" at the third stage of the charging period T1. In other words, energy supplied from the voltage source 41 to the charging and discharging circuit 30 is "(Q/3)·E". The energy "(Q/3)·E" is consumed by the resistance components on the circuits by "QE/18" at each of the first stage, the second stage, and, the third stage of the charging period T1 and the first stage, the second stage, and the third stage of the discharging period T2.

In this way, the energy consumption of the charging and discharging circuit 30 is reduced to ⅓ of that in the past.

In this embodiment, the voltages at the three stage levels "E", "2E/3", and "E/3" are sequentially charged in the actuator Z1. The stage levels of charging voltage may be X stage levels equal to or larger than four stage levels. In this case, the voltage source 42 only has to output intermediate voltages of "X−1" stage levels. The energy consumption of the charging and discharging circuit 30 is reduced to 1/X of that in the past.

A charge pump operation during discharging of the actuator Z1 related to reliability secured when the driving device shown in FIG. 19 is integrated-circuited is explained below.

Peak voltage generation by the charge pump operation occurs when electric charge stored in the actuator Z1 is discharged. Therefore, the first stage, the second stage, and the third stage of the discharging period T2 only have to be considered.

At a starting point of the third stage of the discharging period T2, voltage stored in the actuator Z1 already falls to "E/3". Discharging at this point is performed in a loop passing through the intermediate voltage source 126 having the voltage "E/3". Therefore, the charge pump operation does not generate voltage exceeding the range of "0" to "E". This action is an action obtained by performing final discharging using a transistor connected to intermediate potential according to the configuration of the present invention and is one of the advantages of the present invention.

At the first stage and the second stage of the discharging period T2, the drain voltage of the MOS transistor S21 is swung to a negative level. However, an absolute value of the peak voltage Vp can be set small by adjusting the ON resistance Rp of the P-channel MOS transistor and the ON resistance Rn of the N-channel MOS transistor or adopting the configuration shown in any one of FIGS. 9 to 13.

Moreover, in the ninth embodiment, a proportional coefficient related to voltage for determining the peak voltage Vp is "E/3". The ninth embodiment is more advantageous than the first embodiment in reducing the peak voltage Vp. This is one of the advantages of the configuration of the present invention.

A tenth embodiment of the present invention is explained below. In the figure, components same as those in the first to ninth embodiments are denoted by the same reference numerals and signs and explanation of the components is omitted.

In the tenth embodiment, as shown in FIG. 25, one end of the smoothing capacitor 129 as the intermediate voltage source is connected to an output terminal of the operational amplifier 124 via the resistor 125. The other end of the smoothing capacitor 129 is connected to an output terminal of the operational amplifier 127 via the resistor 128.

Specifically, the intermediate voltage source 129 obtains the voltage "E/3" with reference to the output voltage "2E/3" of the intermediate voltage source 126 unlike the voltage "E/3" obtained with reference to the zero potential of the ground line as shown in FIG. 19 in the ninth embodiment.

In this embodiment, a charging path at the first stage of the charging period T1 and a charging path at the second stage of the discharging period T2 are different from those shown in FIG. 19 in the ninth embodiment.

Specifically, at the first stage of the charging period T1, as indicated by an arrow in FIG. 25, the voltage "E/3" of the intermediate voltage source 129 is applied to the actuator Z1 in the forward direction by turning on the MOS transistors S13 and S24. At this point, the electric charge "Q/3" flows out from the intermediate voltage source 129 and is stored in the actuator Z1.

Figure 26:
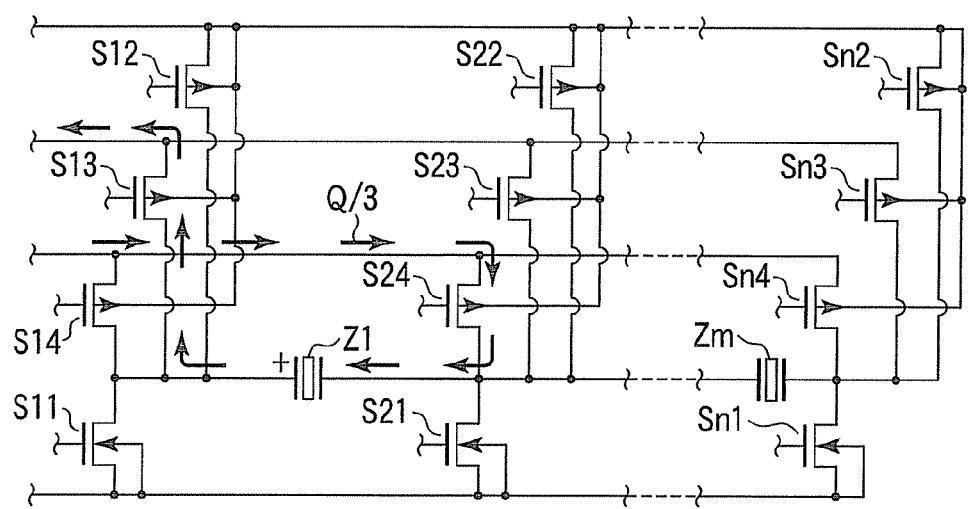
FIG. 26 is a circuit diagram showing path in a first stage of discharging according to the tenth embodiment.

At the second stage of the discharging period T2, as indicated by an arrow in FIG. 26, the actuator Z1 is discharged by turning on the MOS transistors S13 and S24. At this point, the electric charge "Q/3" stored in the actuator Z1 returns to the intermediate voltage source 129. Since the MOS transistor S21 is off, the drain voltage of the MOS transistor S21 is not swung to a negative level. Therefore, the outflow of electric current from the back gates or the integrated circuit substrate due to the influence of the peak voltage Vp has to be considered only at the first stage of the discharging period T2. In this regard, reliability can be further easily improved than in the ninth embodiment.

In the tenth embodiment, the voltages of the three stage levels "E", "2E/3", and "E/3" are sequentially charged in the actuator Z1. However, the stage levels of charging voltage may be X stage levels equal to or larger than four stage levels. In this case, if intermediate voltages of the voltage source 42 are obtained with reference to the intermediate voltage source of having highest output voltage rather than the zero potential of the ground line, swinging of the drain voltage of the N-channel MOS transistor to a negative level can be limited to only the first stage of the discharging period T2.

An eleventh embodiment of the present invention is explained below. In the drawings referred to below, components same as those in the first to tenth embodiments are denoted by the same reference numerals and signs and explanation of the components is omitted.

As shown in FIG. 27, the smoothing capacitor 43 is connected in parallel to the voltage source 41. The voltage source 42 includes a series circuit (a voltage dividing circuit) of resistors 131, 132, 133, 134, and 135 connected to both the ends of the voltage source 41, an operational amplifier 136 that amplifies, with a gain "1", voltage generated in a series circuit of the resistors 132, 133, 134, and 135, an operational amplifier 137 that amplifies, with a gain "1", voltage generated in a series circuit of the resistors 133, 134, and 135, an operational amplifier 138 that amplifies, with a gain "1", voltage generated in a series circuit of the resistors 134 and 135, an operational amplifier 139 that amplifies, with a gain "1", voltage generated in the resistor 135, a smoothing capacitor 141 (hereinafter referred to as intermediate voltage source 141) to which output voltage "4E/5" of the operational amplifier 136 is applied via a resistor 140, a smoothing capacitor 143 (hereinafter referred to as intermediate voltage source 143) to which output voltage "3E/5" of the operational amplifier 137 is applied via a resistor 142, a smoothing capacitor 145 (hereinafter referred to as intermediate voltage source 145) to which output voltage "2E/5" of the operational amplifier 138 is applied via a resistor 144, a smoothing capacitor 147 (hereinafter referred to as intermediate voltage source 147) to which output voltage "E/5" of the operational amplifier 139 is applied via a resistor 146, and switch elements such as MOS transistors Sd, Sc, Sb, and Sa.

The MOS transistors Sd and Sc are P-channel MOS transistors. Back gates thereof are connected to the positive side output terminal of the voltage source 41 and gates thereof connected to the logic circuit 50. The MOS transistors Sd and Sc open and close charge/discharge paths between the intermediate voltage sources 141 and 143 and the charging and discharging circuit 30. The MOS transistors Sb and Sa are N-channel MOS transistors. Back gates thereof are connected to the ground line and gates thereof are connected to the logic circuit 50. The MOS transistors Sb and Sa open and close charge/discharge paths between the intermediate voltage sources 145 and 147 and the charging and discharging circuit 30.

When the MOS transistor Sd is turned on, the voltage "4E/5" of the intermediate voltage source 141 is applied to the series circuit of the MOS transistors S13 and S11, the series circuit of the MOS transistors S23 and S21, . . . , and the series circuit of the MOS transistors Sn3 and Sn1 in the charging and discharging circuit 30. When the MOS transistor Sc is turned on, the voltage "3E/5" of the intermediate voltage source 143 is applied to the series circuit of the MOS transistors S13 and S11, the series circuit of the MOS transistors S23 and S21, . . . , and the series circuit of the MOS transistors Sn3 and Sn1 in the charging and discharging circuit 30. When the MOS transistor Sb is turned on, the voltage "2E/5" of the intermediate voltage source 145 is applied to the series circuit of the MOS transistors S13 and S11, the series circuit of the MOS transistors S23 and S21, . . . , and the series circuit of the MOS transistors Sn3 and Sn1 in the charging and discharging circuit 30. When the MOS transistor Sa is turned on, the voltage "E/5" of the intermediate voltage source 143 is applied to the series circuit of the MOS transistors S13 and S11, the series circuit of the MOS transistors S23 and S21, . . . , and the series circuit of the MOS transistors Sn3 and Sn1 in the charging and discharging circuit 30.

The MOS transistors Sd, Sc, Sb, and Sa are provided in common to supply intermediate voltages to the actuators Z1 in the respective channels.

Other components are the same as those in the first embodiment.

In this way, the intermediate voltages "4E/5", "3E/5", "2E/5", and "E/5" of the voltage source 42 are selectively supplied to the charging and discharging circuit 30 via the MOS transistors Sd, Sc, Sb, and Sa. This makes it possible to increase stage levels of charging voltage without increasing the number of switch elements in the charging and discharging circuit 30. If the charging and discharging circuit 30 is formed as a monolithic IC, the charging and discharging circuit 30 is easily reduced in size.

The P-channel and N-channel MOS transistors are selectively adopted. This is as a result of selecting conditions with a small back gate effect such that a transistor area is as small as possible when ON resistances of the MOS transistors are a predetermined value. This is because the ON resistances are increased by the back gate effect. For simplification, all the MOS transistors of the charging and discharging circuit 30 may be P-channel MOS transistors or N-channel MOS transistors.

The MOS transistors Sd, Sc, Sb, and Sa of the voltage source 42 may be integrated in one monolithic IC together with the charging and discharging circuit 30, may be formed as an IC separate from the charging and discharging circuit 30, or may be formed in a discrete configuration.

Figure 28:
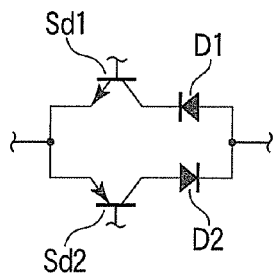
FIG. 28 is a diagram of a modification of a main part according to the eleventh embodiment.
Figure 29:
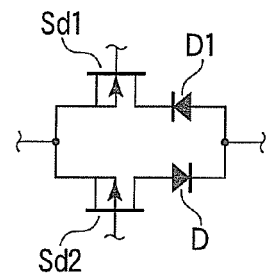
FIG. 29 is a diagram of another modification of the main part according to the eleventh embodiment.

Each of the MOS transistors Sd, Sc, Sb, and Sa of the voltage source 42 may be replaced with a CMOS transistor formed by combining a P-channel transistor and an N-channel transistor. Alternatively, a switch element having directivity such as a bipolar transistor or a D-MOS transistor may be used. When the bipolar transistor is used, as shown in FIG. 28, two bipolar transistors only have to be connected in parallel via diodes D1 and D2, respectively, and used as one bidirectional switch element. When the D-MOS transistor is used, as shown in FIG. 29, two D-MOS transistors only have to be connected in parallel via the diodes D1 and D2, respectively, and used as one bidirectional switch element.

Figure 30:
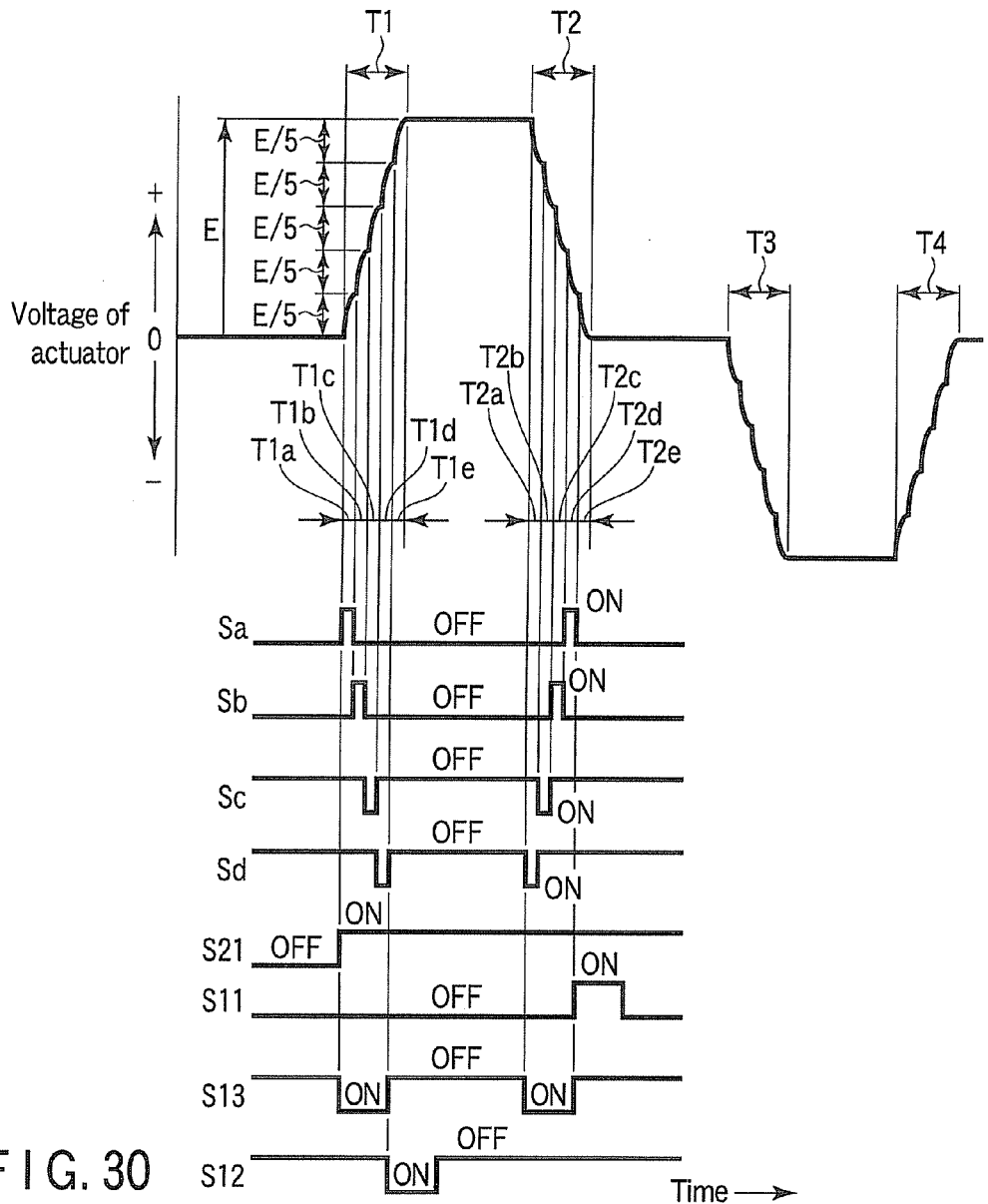
FIG. 30 is a diagram for explaining actions of the eleventh embodiment.

Actions of the driving device shown in FIG. 27 are explained with reference to FIG. 30.

In the charging period T1 by the forward energization, the MOS transistors S13 and S21 are turned on and the MOS transistors Sa, Sb, Sc, and Sd are sequentially and exclusively turned on. Subsequently, the MOS transistor S13 is turned off and the MOS transistor S12 is turned on while the MOS transistor S21 is kept on.

As the first stage T1a of the charging period T1 by the forward energization, the voltage "E/5" of the intermediate voltage source 147 is applied to the actuator Z1. At this point, electric charge "Q/5" flows out from the intermediate voltage source 147 and is additionally stored in the actuator Z1.

Subsequently, as the second stage T1b of the charging period T1, the voltage "2E/5" of the intermediate voltage source 145 is applied to the actuator Z1. At this point, the electric charge "Q/5" flows out from the intermediate voltage source 145 and is additionally stored in the actuator Z1.

As a third stage T1c of the charging period T1, the voltage "3E/5" of the intermediate voltage source 143 is applied to the actuator Z1. At this point, the electric charge "Q/5" flows out from the intermediate voltage source 143 and is additionally stored in the actuator Z1.

As a fourth stage T1d of the charging period T1, the voltage "4E/5" of the intermediate voltage source 141 is applied to the actuator Z1. At this point, the electric charge "Q/5" from the intermediate voltage source 141 flows out and is additionally stored in the actuator Z1.

As a fifth stage T1e of the charging period T1, the voltage "E" of the voltage source 41 is applied to the actuator Z1. At this point, the electric charge "Q/5" flows out from the voltage source 41 and is stored in the actuator Z1.

After the charging, in the discharging period T2, the MOS transistor S13 is turned on while the MOS transistor S21 is kept on. The MOS transistors Sd, Sc, Sb, and Sa are sequentially and exclusively turned on. Subsequently, the MOS transistor S13 is turned off and the MOS transistor S11 is turned on while the MOS transistor S21 is kept on.

As the first stage T2a of the discharging period T2, the actuator Z1 discharges to the intermediate voltage source 141. At this point, "Q/5" of the electric charge stored in the actuator Z1 returns to the intermediate voltage source 141.

Subsequently, as the second stage T2b of the discharging period T2, the actuator Z1 discharges to the intermediate voltage source 143. At this point, "Q/5" of the electric charge stored in the actuator Z1 returns to the intermediate voltage source 143.

As a third stage T2c of the discharging period T2, the actuator Z1 discharges to the intermediate voltage source 145. At this point, "Q/5" of the electric charge stored in the actuator Z1 returns to the intermediate voltage source 145.

As a fourth stage T2d of the discharging period T2, the actuator Z1 discharges to the intermediate voltage source 147. At this point, "Q/5" of the electric charge stored in the actuator Z1 returns to the intermediate voltage source 147.

As a fifth stage T2e of the discharging period T2, the actuator Z1 discharges in a closed circuit that passes through the MOS transistors S11 and S21. At this point, the electric charge "Q/5" stored in the actuator Z1 is consumed by resistance components on a discharging path. Consequently, the voltage, of the actuator Z1 falls to zero.

Electric charge input to and electric charge output from the intermediate voltage source 141 during charging and during discharging of the actuator Z1 are equal. The intermediate voltage source 141 does not consume power. Electric charge input to and electric charge output from the intermediate voltage sources 143, 145, and 147 during charging and during discharging of the actuator Z1 are also equal. The intermediate voltage sources 143, 145, and 147 do not consume power.

The voltage source 41 discharges the electric charge "Q/5" at the fifth stage T1e of the charging period T1. In other words, energy supplied from the voltage source 41 to the charging and discharging circuit 30 is "Q·E/5". The energy "Q·E/5" is consumed by the resistance components on the circuits by "Q·E/50" at each of the stages of the charging period T1 and the discharging period T2.

Therefore, the energy consumption of the charging and discharging circuit 30 is reduced to ⅕ of that in the past.

In the charging period T3 by the backward energization and the discharging period T4 after that, the operation of the MOS transistors is symmetrical to the operation in the charging period T1 and the discharging period T2. Therefore, explanation of the operation is omitted.

At the stages of the discharging period T2, the drain voltage of the N-channel MOS transistor S21 is swung to a negative level. However, an absolute value of the peak voltage Vp can be set small by adjusting the ON resistance Rp of the P-channel MOS transistor and the ON resistance Rn of the N-channel MOS transistor or adopting the configuration shown in any one of FIGS. 9 to 13.

Moreover, a proportional coefficient related to voltage for determining the peak voltage Vp is "E/5". This embodiment is more advantageous than the first embodiment in reducing the peak voltage Vp.

Since the MOS transistors Sd, Sc, Sb, and Sa are provided in common to supply intermediate voltages to the actuators Z1 in the respective channels, the configuration of the driving device is simplified.

Figure 31:
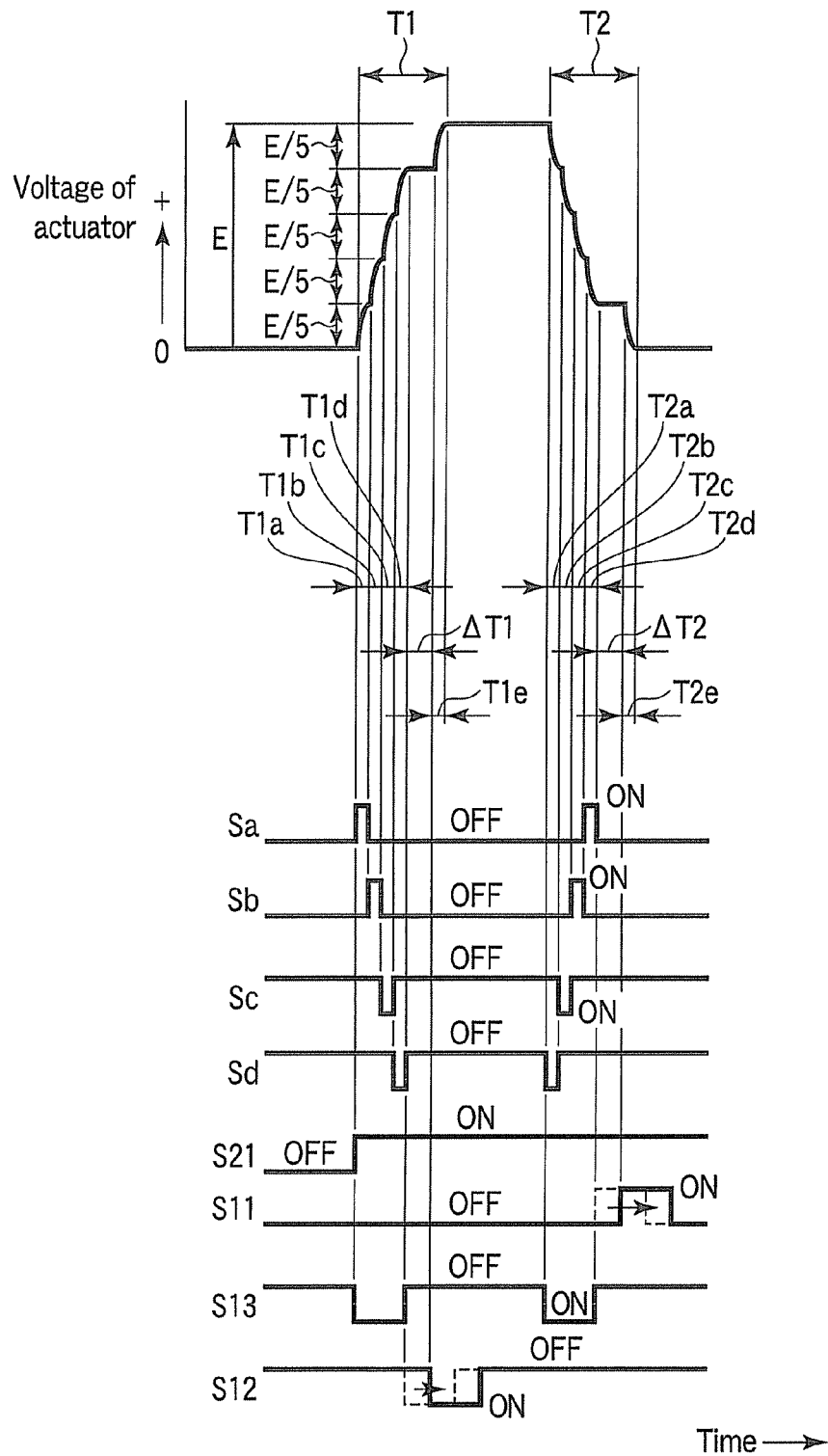
FIG. 31 is a diagram for explaining actions of a modification of the eleventh embodiment.

As shown in FIG. 31, starting timing for the fifth stage T1e of the charging period T1 is determined by ON timing for the MOS transistor S12. Starting timing for the fifth stage T2e of the discharging period T2 is determined by ON timing for the MOS transistor S11. Therefore, the ON timings for the MOS transistors S12 and S11 can be adjusted and a time difference ΔT1 between the fourth stage T1d and the fifth stage T1e in the charging period T1 and a time difference ΔT2 between the fourth stage T2d and the fifth stage T2e in the discharging period T2 can be adjusted for each of the actuators corresponding to the respective channels. This makes it possible to correct a jet volume and jet speed for each of the channels as in the seventh embodiment.

A twelfth embodiment of the present invention is explained below. In the drawings referred to below, components same as those shown in FIG. 27 are denoted by the same reference numerals and signs and explanation of the components is omitted.

Figure 32:
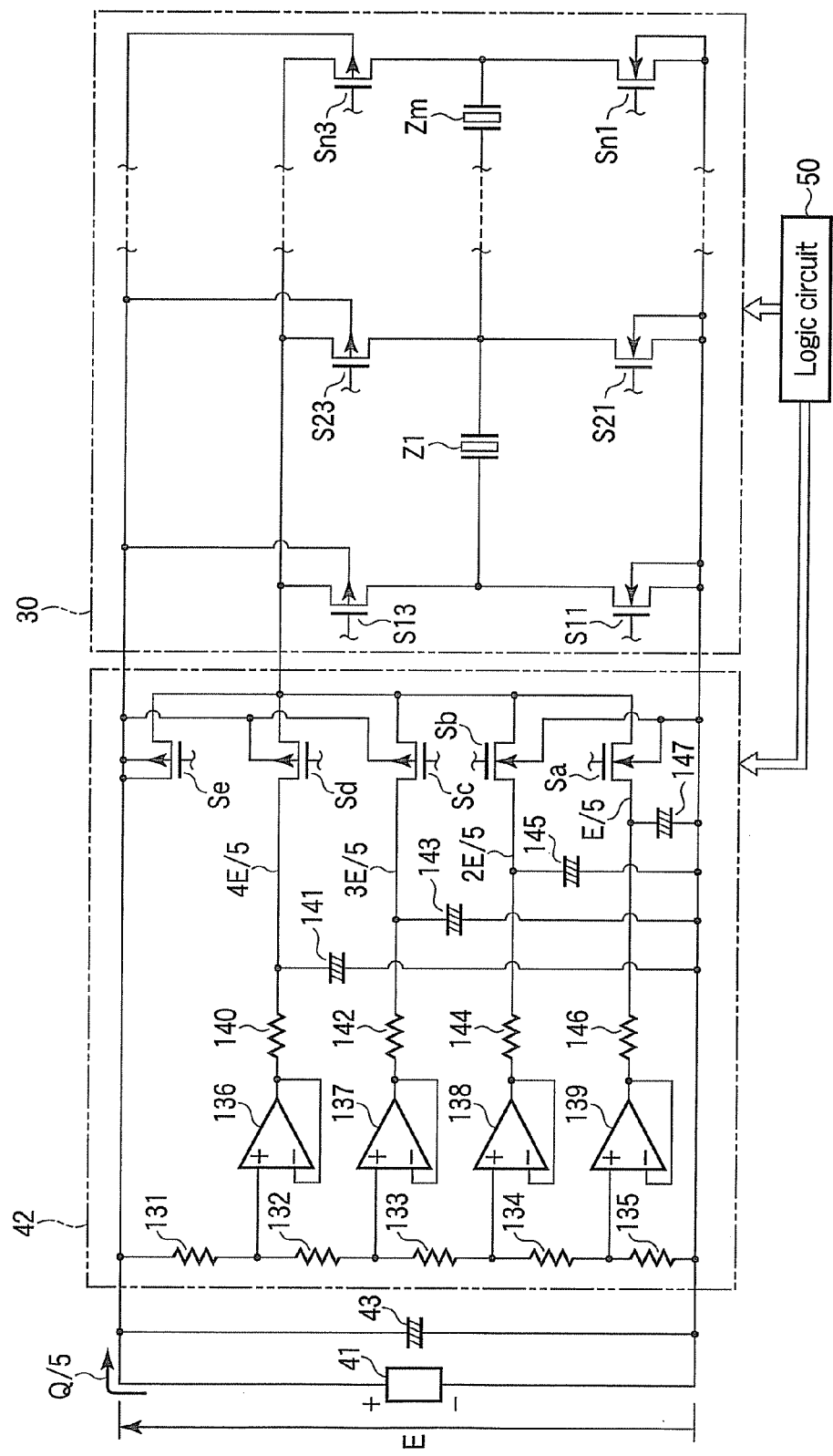
FIG. 32 is a circuit diagram of a driving device according to a twelfth embodiment of the present invention.

As shown in FIG. 32, a switch element, for example, a P-channel MOS transistor Se for opening and closing an energization path between the voltage source 41 and the charging and discharging circuit 30 is added to the voltage source 42. Source to drain of the MOS transistor Se is inserted in and connected to a connection line between the positive side output terminal of the voltage source 41 and the charging and discharging circuit 30. A gate of the MOS transistor Se is connected to the logic circuit 50. According to the adoption of the MOS transistor Se, the MOS transistors S12, S22, ..., and Sn2 in the charging and discharging circuit 30 are removed.

The MOS transistor Se is a MOS transistor for selectively separating, from both the ends of the voltage source 41, a discharging path from an actuator.

Figure 33:
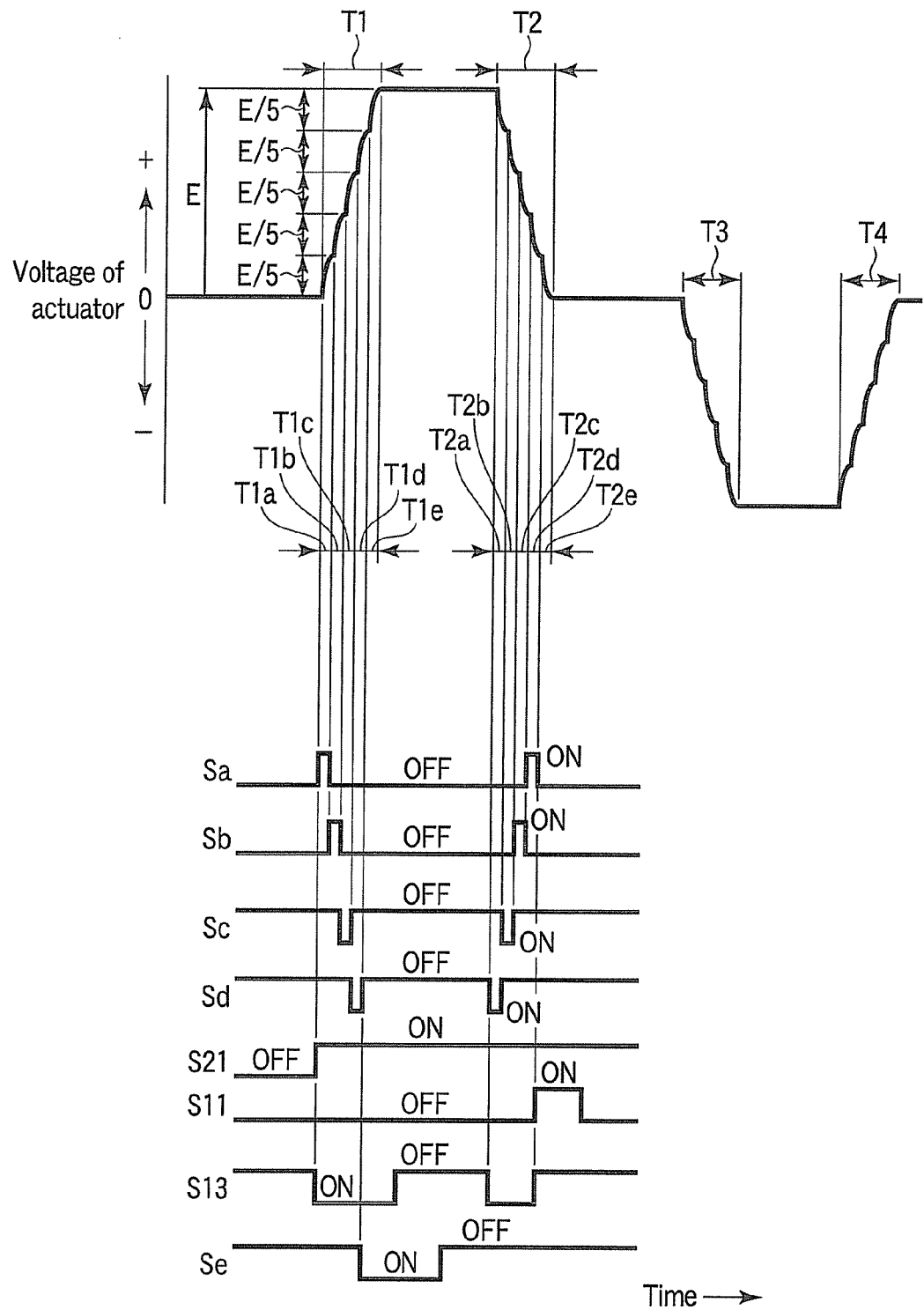
FIG. 33 is a diagram for explaining actions of the twelfth embodiment.

As shown in FIG. 33, at the fifth stage T1e of the charging period T1, the voltage "E" of the voltage source 41 is applied to the actuator Z1 via the MOS transistors Se, S13, and S21. In the discharging period T2, the MOS transistor Se is turned off.

Other components and actions are the same as those in the eleventh embodiment.

According to the twelfth embodiment, since the MOS transistors S12, S22, . . . , and Sn2 of the charging and discharging circuit 30 are removed according to the adoption of the MOS transistor Se, the number of MOS transistors decreases and the configuration is further simplified.

Figure 34:
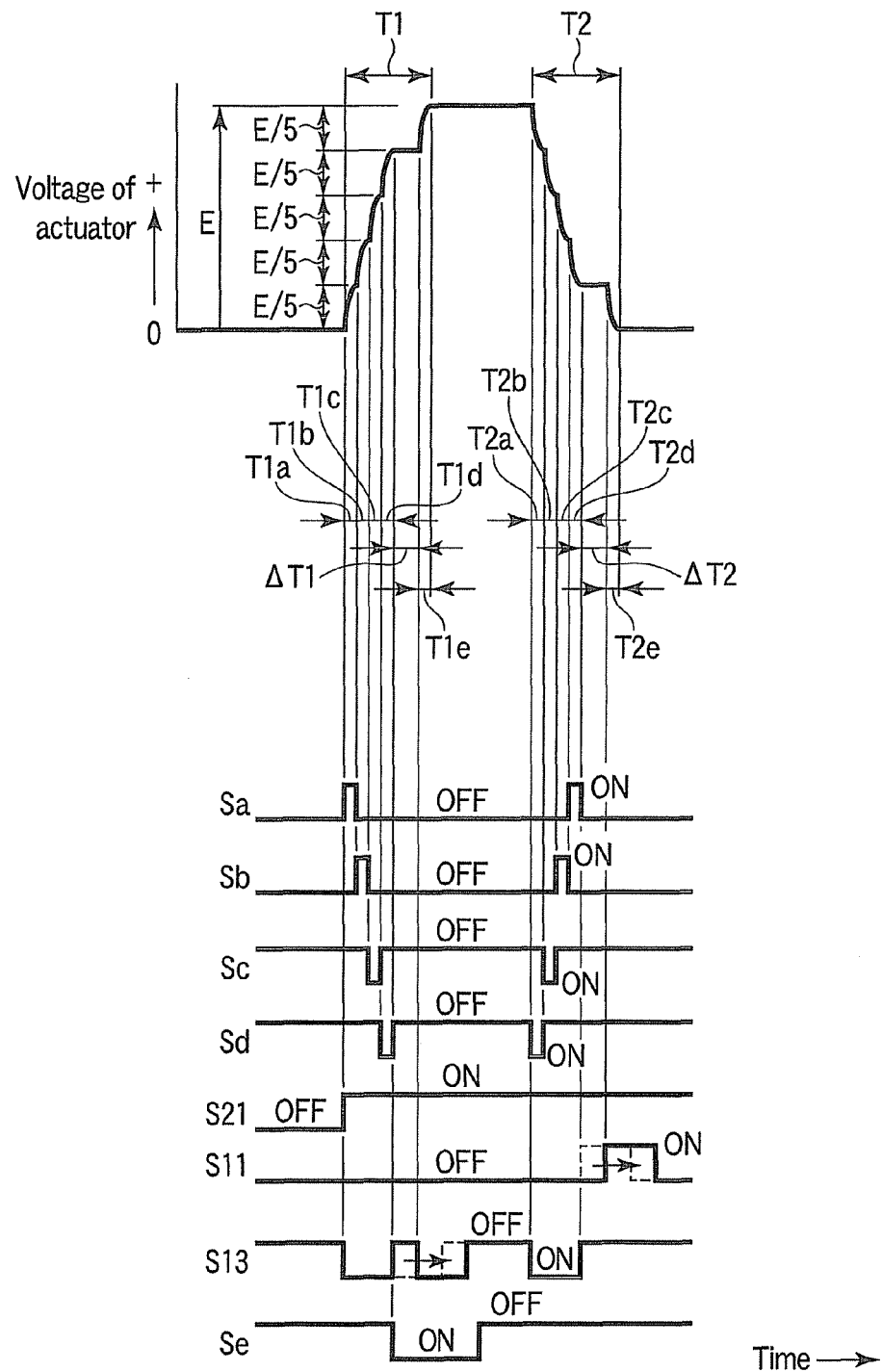
FIG. 34 is a diagram for explaining actions of a modification of the twelfth embodiment.

FIG. 34 is a diagram of an example of a driving waveform in finely adjusting a jet amount in this configuration. After the charging at the fourth stage T1d ends, the MOS transistor S13 is turned off and the MOS transistor Se is turned on once and, at the fifth stage T1e, the MOS transistor S13 is turned on again. Starting timing for the fifth stage T1e of the charging period T1 is determined by the ON timing for the MOS transistor S13. Similarly, starting timing for the fifth stage T2e of the discharging period T2 is also determined by the ON timing for the MOS transistor 511. Mos transistors S11, S21, . . . , and Sn3 and MOS transistors S11, S21, . . . , and Sn1 are independently controllable each other. Therefore, the ON timings for the MOS transistors S13 and S11 can be adjusted and a time difference ΔT1 between the fourth stage T1d and the fifth stage T1e in the charging period T1 and a time difference ΔT2 between the fourth stage T2d and the fifth stage T2e in the discharging period T2 can be adjusted for each of the actuators corresponding to the respective channels. This makes it possible to correct a jet volume and jet speed for each of the channels as in the seventh embodiment.

A thirteenth embodiment of the present invention is explained below. In the drawings referred to below, components same as those shown in FIG. 27 are denoted by the same reference numerals and signs and explanation of the components is omitted.

As shown in FIG. 35, a switch element, for example, the P-channel MOS transistor Se for selectively opening and closing the charging and discharging path between the voltage source 41 and the charging and discharging circuit 30 is added to the voltage source 42. Further, a switch element, for example, an N-channel MOS transistor Sf for opening and closing the energization path between the voltage source 41 and the charging and discharging circuit 30 is added to the voltage source 42. The source to drain of the MOS transistor Se is inserted in and connected to the connection line between the positive side output terminal of the voltage source 41 and the charging and discharging circuit 30. Source to drain of the MOS transistor Sf is connected between the intermediate voltage sources 141, 143, 145, and 147 and the ground line. Gates of the MOS transistors Se and Sf are connected to the logic circuit 50.

Analog switches 151, 152, 153, and 154 are respectively inserted in connection lines between output terminals of the operational amplifiers 136, 137, 138, and 139 and the resistors 140, 142, 144, and 146. The analog switches 151, 152, 153, and 154 are turned on when a control signal supplied from the logic circuit 50 is at a high level "H" and is turned off when the control signal is at a low level "L".

Figure 36:
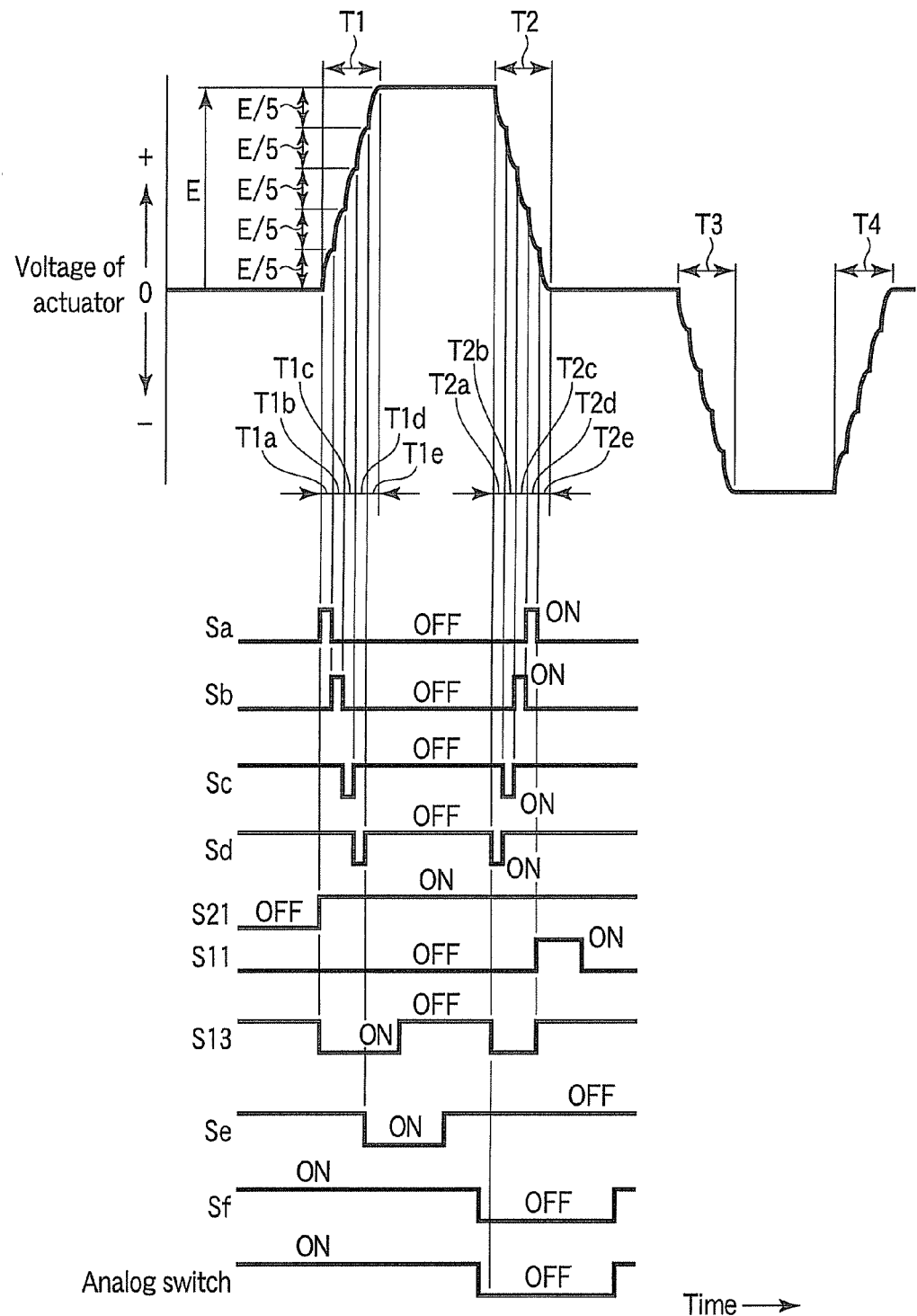
FIG. 36 is a diagram for explaining actions of the thirteenth embodiment.

As shown in FIG. 36, the analog switches 151, 152, 153, and 154 and the MOS transistors Sf are turned off in the discharging period T2 (and T4) in which the actuator Z1 is discharged and are turned on in the other periods. In the discharging period T2 (and T4), since the MOS transistor Se is also turned off, the discharging path is completely disconnected from the voltage source 41. During discharging, since a maximum potential difference between any points within the discharging path is equal to or smaller than the voltage "E", electric current does not flow between the discharging path and the voltage source 41. Therefore, the charge pump operation is not generated in the driving device shown in FIG. 35. In other words, there is an advantage that it is unlikely that reliability based on the peak current Ip and the peak voltage Vp falls.

Other components, actions, and effects are the same as those in the twelfth embodiment.

As shown in FIG. 37, starting timing for the fifth stage T1e of the charging period T1 is determined by the ON timing for the MOS transistor S13. Starting timing for the fifth stage T2e of the discharging period T2 is determined by the ON timing for the MOS transistor S11. Therefore, the ON timings for the MOS transistors S13 and S11 can be adjusted and the time difference ΔT1 between the fourth stage T1d and the fifth stage T1e in the charging period T1 and the time difference ΔT2 between the fourth stage T2d and the fifth stage T2e in the discharging period T2 can be adjusted for each of the actuators corresponding to the respective channels. This makes it possible to correct a jet volume and jet speed for each of the channels as in the seventh embodiment.

A fourteenth embodiment of the present invention is explained below. In the drawings referred to below, components same as those in the first to thirteenth embodiments are denoted by the same reference numerals and signs and explanation of the components is omitted.

As an example of an ink jet head, there is an ink jet head in which two channels adjacent to each other share one actuator. This is an ink jet head of a type called a shear mode and shared wall. In the ink jet head of such a type, when an ink is jetted from one nozzle, two actuators are used. Therefore, one actuator is shared as an actuator for ink jet of two nozzles adjacent to each other. Electrodes of the actuators are sequentially connected in series. Even in the ink jet head of such a type, the embodiments can be applied.

Actions obtained when the driving device shown in FIG. 3 according to the first embodiment is mounted on the ink jet head of the type called shear mode or shared wall are explained with reference to FIG. 4 and FIGS. 38 to 45. In this case, actuators Z1, Z2, . . . , and Zm having capacitance "C/2" are used.

At the first stage T1a of the charging period T1, as indicated by an arrow in FIG. 38, the output voltage "E/2" of the voltage source 42 is applied to the actuator Z1 in the forward direction by turning on the MOS transistors S13 and S21. At this point, the electric charge "Q/2" flows out from the voltage source 42 and electric charge "Q/4" half as large as the electric charge "Q/2" is stored in the actuator Z1. At the same time, the output voltage "E/2" of the voltage source 42 is applied to the actuator Z2 in the backward direction by turning on the MOS transistors S33 and S21. At this point, the remaining half electric charge "Q/4" of the electric charge "Q/2" flowing out from the voltage source 42 is stored in the actuator Z2.

Figure 39:
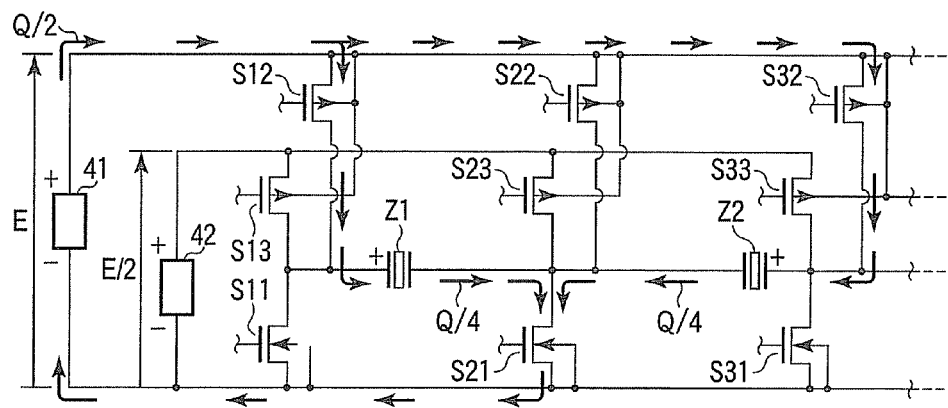
FIG. 39 is a circuit diagram showing path in a second stage of charging of the charging period in the forward direction according to the fourteenth embodiment.

At the second stage T1b of the charging period T1, as indicated by an arrow in FIG. 39, the output voltage "E" of the voltage source 41 is applied to the actuator Z1 in the forward direction by turning on the MOS transistors S12 and S21. At this point, the electric charge "Q/2" flows out from the voltage source 41 and the electric charge "Q/4" half as large as the electric charge "Q/2" is stored in the actuator Z1. At the same time, the output voltage "E" of the voltage source 41 is applied to the actuator Z2 in the backward direction by turning on the MOS transistors S32 and S21. At this point, the remaining half electric charge "Q/4" of the electric charge "Q/2" flowing out from the voltage source 41 is stored in the actuator Z2.

According to the first stage T1a and the second stage T1b, the electric charge "Q/2" is stored in the actuator Z1 and the electric charge "Q/2" is stored in the actuator Z2.

Figure 40:
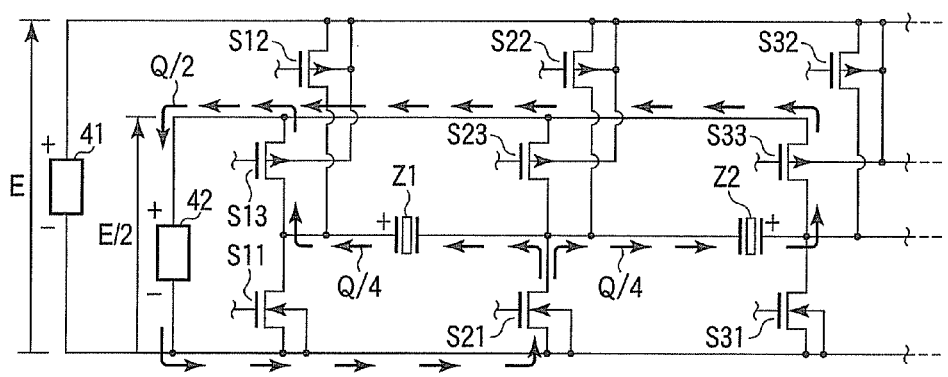
FIG. 40 is a circuit diagram showing path in a first stage of charging of a discharging period following charging in the forward direction according to the fourteenth embodiment.

At the first stage T2a of the discharging period T2, as indicated by an arrow in FIG. 40, the electric charge "Q/4" half as large as the electric charge "Q/2" stored in the actuator Z1 is discharged on a path returning to the voltage source 42 by turning on the MOS transistors S13 and S21. At the same time, the electric chare "Q/4" half as large as the electric charge "Q/2" stored in the actuator Z2 is discharged on a path returning to the voltage source 42 by turning on the MOS transistors S33 and S21.

Figure 41:
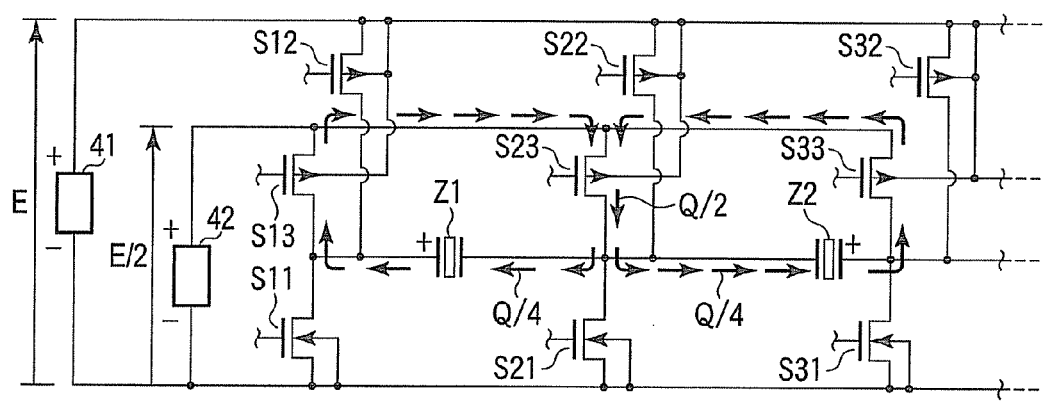
FIG. 41 is circuit diagram showing path in a second stage of discharging of the discharging period following the charging in the forward direction according to the fourteenth embodiment.

At the second stage T2b of the discharging period T2, as indicated by an arrow in FIG. 41, the remaining electric charge "Q/4" stored in the actuator Z1 is discharged on a closed circuit passing through the MOS transistors S13 and S23 by turning on the MOS transistors S13 and S23 and is consumed by resistance components on a discharging path of the closed circuit. Consequently, the voltage of the actuator Z1 falls to zero. At the same time, the remaining electric charge "Q/4" stored in the actuator Z2 is discharged on a closed circuit passing through the MOS transistors S33 and S23 by turning on the MOS transistors S33 and S23 and consumed by resistance components on a discharging path of the closed circuit. Consequently, the voltage of the actuator Z2 falls to zero.

A charging loss at the first stage T1a of the charging period T1 is a value obtained by deducting energy stored in the actuators Z1 and Z2 from energy supplied by the voltage source 42 and is represented by the following formula:

$$(Q/2) \cdot E - \{[(Q/2)E/2] - [(Q/4) \cdot (E/2)/2] \cdot 2 = (Q \cdot E)/8$$

A charging loss at the second stage T2a of the charging period T1 is a value obtained by deducting energy added to the actuators Z1 and Z2 from energy supplied by the voltage source 41 and is represented by the following formula:

$$(Q/2) \cdot E - \{(Q \cdot E)/4 - [(Q/2) \cdot (E/4)]/2\} \cdot 2 = (Q \cdot E)/8$$

A discharging loss at the first stage T2a of the discharging period T2 is a value obtained by deducting energy returned to the voltage source 42 from energy extracted from the actuators Z1 and Z2 and is represented by the following formula:

$$\{[(Q/2) \cdot E]/2 - [(Q/4) \cdot (E/2)]/2\} \cdot 2 - [(Q/4) \cdot (E/2)] = (Q \cdot E)/8$$

A discharging loss at the second stage T2b of the discharging period T2 is energy remaining in the actuators Z1 and Z2 and is represented by the following formula:

$$[(Q/4) \cdot (E/2)/2] \cdot 2 = (Q \cdot E)/8$$

The voltage source 41 discharges the electric charge "Q/2" at the first stage T1a of the charging period T1. That is, the voltage source 41 discharges the energy of "(Q·E)/2" at this stage. The energy "(Q/E)/2" is equal to total energy "[(Q·E)/8]·4" consumed by the driving device at all the stages T1a, T1b, T2a, and T2b of the charging period T1 and the discharging period T2.

The voltage source 42 discharges the electric charge "Q/2" at the first stage T1a of the charging period T1. However, since the voltage source 42 receives the electric charge "Q/2" at the first stage T2a of the discharging period T2, the voltage source 42 does not consume power. This means that the voltage source 42 only has to have an electricity storing function and a small-capacity supply ability enough for correcting a slight shift of electric charge.

At the starting point of the first stage T2a in the discharging period T2, the drain voltage of the N-channel MOS transistor S21 is swung to a negative level. When peak current of a positive value flowing through the transistor S21 at the starting point of the first stage T2a is represented as Ip and the ON resistance of the MOS transistor S21 is represented as Rn, peak voltage Vp of a negative level applied to the drain of the MOS transistor S21 is represented by the following formula:

$$Vp = -Ip \cdot Rn$$

When the ON resistances of the P-channel MOS transistors S13 and S33 are represented as Rp and the equivalent series resistances of the actuators Z1 and Z2 are represented as Rc, peak current Ip is represented by the following formula:

$$Ip = (E/2)/[(Rp+Rc)/2+Rn]$$

When the peak current Ip is substituted in the formula of the peak voltage Vp, the peak voltage Vp is represented by the following formula:

$$Vp = -(E/2) \cdot Rn/[(Rp+Rc)/2+Rn]$$

As explained above, the formulas for calculating Ip and Vp are different from those in the third embodiment. However, it only has to be considered that electric currents flowing through the two actuators Z1 and Z2 are superimposed and flow through the MOS transistors S21 at the stage T1a, T1b, and T2a, and through the MOS transistor S23 at the stage T2b. Basic idea in this embodiment is the same as that in the third embodiment.

Figure 42:
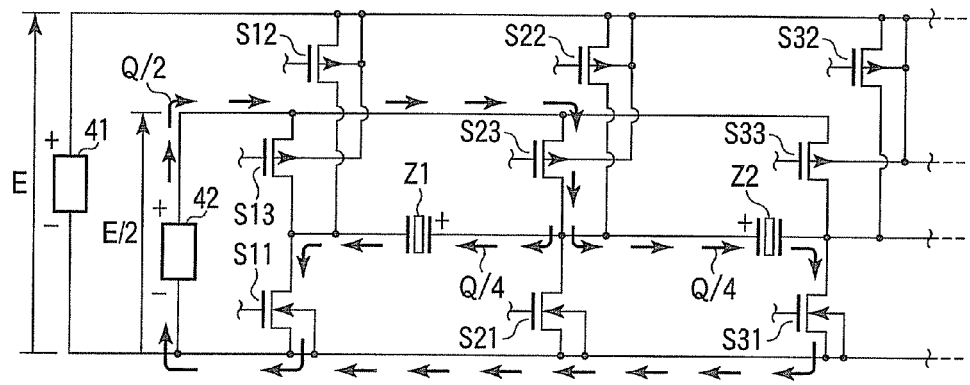
FIG. 42 is a circuit diagram showing path in a first stage of charging of a charging path at a first stage of a charging period in a backward direction according to the fourteenth embodiment.

On the other hand, at the first stage T3a of the charging period T3 for dumping, as indicated by an arrow in FIG. 42, the output voltage "E/2" of the voltage source 42 is applied to the actuator Z1 in the backward direction by turning on the MOS transistors S23 and S11. At this point, the electric charge "Q/2" flows out from the voltage source 42 and the electric charge "Q/4" half as large as the electric charge "Q/2" is stored in the actuator Z1. At the same time, the output voltage "E/2" of the voltage source 42 is applied to the actuator Z2 in the forward direction by turning on the MOS transistors S23 and S31. At this point, the remaining half electric charge "Q/4" of the electric charge "Q/2" flowing out from the voltage source 42 is stored in the actuator Z2.

Figure 43:
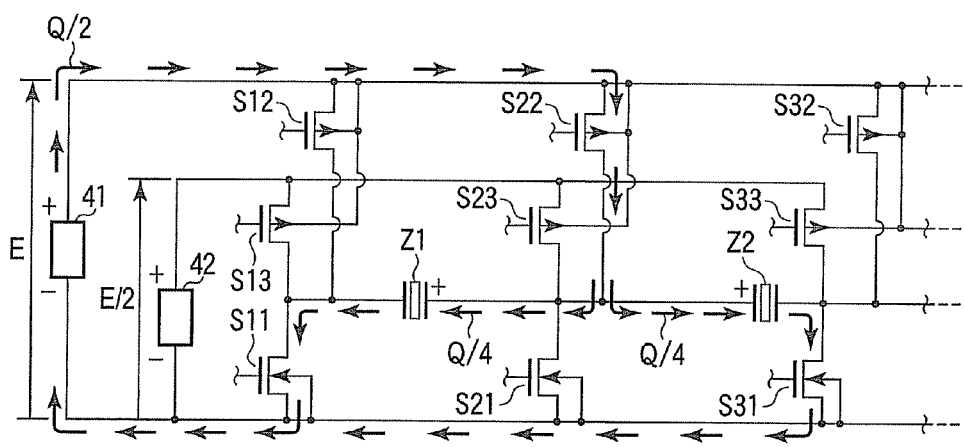
FIG. 43 is a circuit diagram showing path in a second stage of charging of the charging period in the backward direction according to the fourteenth embodiment.

At the second stage T3b of the charging period T3, as indicated by an arrow in FIG. 43, the output voltage "E" of the voltage source 41 is applied to the actuator Z1 in the backward direction by turning on the MOS transistors S22 and S11. At this point, the electric charge "Q/2" flows out from the voltage source 41 and the electric charge "Q/4" half as large as the electric charge "Q/2" is stored in the actuator Z1. At the same time, the output voltage "E" of the voltage source 41 is applied to the actuator Z2 in the forward direction by turning on the MOS transistors S22 and S31. At this point, the remaining half electric charge "Q/4" of the electric charge "Q/2" flowing out from the voltage source 41 is stored in the actuator Z2.

According to the first stage T3a and the second stage T3b, the electric charge "Q/2" is stored in the actuator Z1 and the electric charge "Q/2" is stored in the actuator Z2.

At the first stage T4a of the discharging period T4, as indicated by an arrow in FIG. 44, the electric charge "Q/4" half as large as the electric charge "Q/2" stored in the actuator Z1 is discharged on the path returning to the voltage source 42 by turning on the MOS transistors S11 and S23. At the same time, the electric chare "Q/4" half as large as the electric charge "Q/2" stored in the actuator Z2 is discharged to return to the voltage source 42 by turning on the MOS transistors S31 and S23.

At the second stage T4b of the discharging period T4, as indicated by an arrow in FIG. 45, the remaining electric charge "Q/4" stored in the actuator Z1 is discharged on the closed circuit passing through the MOS transistors S13 and S23 by turning on the MOS transistors S13 and S23 and is consumed by the resistance components on the discharging path of the closed circuit. Consequently, the voltage of the actuator Z1 falls to zero. At the same time, the remaining electric charge "Q/4" stored in the actuator Z2 is discharged on the closed circuit passing through the MOS transistors S33 and S23 by turning on the MOS transistors S33 and S23 and consumed by the resistance components on the discharging path of the closed circuit. Consequently, the voltage of the actuator Z2 falls to zero.

At the starting point of the first stage T4a in the discharging period T4 (FIG. 44), the drain voltages of the N-channel MOS transistors S11 and S31 are swung to a negative level. When peak currents of a positive value flowing through the transistors S11 and S31 at the starting point of the first stage T4a are represented as Ip and the ON resistances of the MOS transistors S11 and S31 are represented as Rn, peak voltage Vp of a negative level applied to the drains of the MOS transistors S11 and S31 is represented by the following formula:

$$Vp=-Ip \cdot Rn$$

When the ON resistance of the P-channel MOS transistor S23 is represented as Rp and the equivalent series resistances of the actuators Z1 and Z2 are represented as Rc, peak current Ip is represented by the following formula:

$$Ip=(E/2)/(2 \cdot Rp+Rc+Rn)$$

When the peak current Ip is substituted in the formula of the peak voltage Vp, the peak voltage Vp is represented by the following formula:

$$Vp=-(E/2) \cdot Rn/(2 \cdot Rp+Rc+Rn)$$

As explained above, the formulas for calculating Ip and Vp are different from those in the first embodiment. However, it only has to be considered that electric currents flowing through the two actuators Z1 and Z2 are superimposed and flow through the MOS transistors S23 at the stage T3b. Basic idea in this embodiment is the same as that in the first embodiment.

Other components, actions, and effects are the same as those in the embodiments explained above.

The example of the application of the first embodiment to the driving circuit of the ink jet head in the shear mode and the shared wall is explained above. The second to thirteenth embodiments can be applied in the same manner.

An example of the ink jet head of the type called the shear mode or the shared wall is shown in FIGS. 46 to 48. FIG. 46 is a diagram of the ink jet head viewed from an oblique direction. FIG. 47 is a diagram of the ink jet head shown in FIG. 46 viewed from a side. FIG. 48 is a diagram of a section of the ink jet head along A-A line in FIG. 47 viewed in an arrow direction.

As shown in FIG. 46, an actuator row 211 and an actuator row 212 are formed on an upper surface of a substrate 201. A frame member 202 is mounted to surround the actuator rows 211 and 212. A nozzle plate 203 is provided on the frame member 202 to cover the actuator rows 211 and 212. A large number of nozzles 204 are formed in rows in positions of the nozzle plate 203 corresponding to the actuator rows 211 and 212.

Each of the actuator rows 211 and 212 are formed by an array of a large number of actuators Z1, Z2, . . . , and Zm. Groove-like channels 205 are secured among the actuators Z1, Z2, . . . , and Zm and in positions corresponding to the nozzles 204.

A large number of ink inlets 206 are formed between the actuator rows 211 and 212 in the substrate 201. Inks flowing into the ink inlets 206 are led to the channels 205. The inks flowing through the channels 205 flow to the outside of the substrate 201 through a large number of ink outlets 207 formed in the substrate 201.

As shown in FIG. 47, a charging and discharging unit 130 including the charging and discharging circuit 30 and the logic circuit 50 for the actuators Z1, Z2, . . . , and Zm of the actuator row 211 is provided on the upper surface of the substrate 201. A charging and discharging unit 130 including the charging and discharging circuit 30 and the logic circuit 50 for the actuators Z1, Z2, . . . , and Zm of the actuator row 212 is also provided on the upper surface of the substrate 201.

As shown in FIG. 48, the actuators Z1, Z2, . . . , and Zm are formed in a columnar shape by vertically bonding piezoelectric elements 221 and 222 of PZT (lead zirconate titanate) serving as capacitance type actuators such that polarization directions thereof are opposed to each other. Among the actuators Z1, Z2, . . . , and Zm, when, for example, the actuators Z1 is charged forward and the actuator Z2 is charged backward as shown in FIG. 38 and FIG. 39, the actuators Z1 and Z2 are deformed as increasing the volume of the channel 205. According to the deformation of the actuators Z1 and Z2, an ink is refilled in the channel 205 between the actuators Z1 and Z2. When the actuators Z1 and Z2 are discharged, the shape of the actuators Z1 and Z2 are restored. According to the restoration, the ink present in the channel 205 between the actuators Z1 and Z2 is jet from the nozzle 204 corresponding to the channel 205. As explained above, the actuators Z1, Z2, . . . , and Zm realize a function of ink jet according to a series of charging and discharging sequence.

Electrodes 223 for the charging and discharging are provided on the sides of the actuators Z1, Z2, . . . , and Zm and the bottom surfaces of the channels 105, respectively. The electrodes 223 and the charging and discharging unit 130 are wired and connected by a conduction pattern on the substrate 101.

Additional advantages and modifications will readily occur to those skilled in the art. Therefore, the invention in its broader aspects is not limited to the specific details and representative embodiment shown and described herein. Accordingly, various modifications may be made without departing from the spirit or scope of the general inventive concept as defined by the appended claims and their equivalents.

What is claimed is:

1. A driving device for a capacitance type actuator that functions according to a series of charging and discharging sequence, the driving device comprising:
    a driving power supply which outputs charging voltage given to the actuator;
    at least one intermediate voltage source including a reference voltage source that outputs reference voltage, a voltage follower circuit that buffers output of the reference voltage source, a smoothing capacitor charged by the output of the voltage follower circuit, and a current limiting unit that limits a current of output of the voltage follower circuit that charges the smoothing capacitor, wherein the intermediate voltage source gives the voltage generated at the smoothing capacitor as intermediate potential at a stage halfway in charging or discharging by the charging and discharging sequence to the actuator;
    a discharging path for discharging electric charge remaining in the actuator and consuming energy corresponding to the electric charge; and
    a controller, in charging the actuator, which charges electric charge in the actuator from the intermediate voltage source and thereafter charging electric charge in the actuator from the driving power supply and, in discharging of the actuator, discharging electric charge from the actuator to the smoothing capacitor of the intermediate voltage source and thereafter discharging electric charge of the actuator with the discharging path.

2. The device according to claim 1, wherein
the electric charge input to the intermediate voltage source from the actuator by the discharging sequence is equal to the electric charge output to the actuator from the intermediate voltage source by the charging of the charging sequence, and
the voltage follower circuit has functions of both a current source and a current sink.

3. The device according to claim 1, wherein
the electric charge input to the intermediate voltage source from the actuator by the discharging sequence is larger than the electric charge output to the actuator from the intermediate voltage source by the charging sequence, and
the voltage follower circuit has a function of a current sink.

4. The device according to claim 1, wherein
the electric charge output to the actuator by the intermediate voltage source by the charging sequence is larger than the electric charge input to the intermediate voltage source from the actuator by the discharging sequence, and
the voltage follower circuit has a function of a current source.

* * * * *